(12) United States Patent
Kawasaki et al.

(10) Patent No.: US 12,484,264 B2
(45) Date of Patent: Nov. 25, 2025

(54) SEMICONDUCTOR DEVICE AND METHOD OF MANUFACTURING SEMICONDUCTOR DEVICE

(71) Applicant: Mitsubishi Electric Corporation, Tokyo (JP)

(72) Inventors: Yuji Kawasaki, Tokyo (JP); Toshihiro Imasaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 468 days.

(21) Appl. No.: 18/066,108

(22) Filed: Dec. 14, 2022

(65) Prior Publication Data
US 2023/0268383 A1 Aug. 24, 2023

(30) Foreign Application Priority Data
Feb. 22, 2022 (JP) .................. 2022-025610

(51) Int. Cl.
*H10D 62/10* (2025.01)
*H10D 30/65* (2025.01)
*H10D 62/13* (2025.01)

(52) U.S. Cl.
CPC .......... *H10D 62/111* (2025.01); *H10D 30/65* (2025.01); *H10D 30/655* (2025.01); *H10D 62/126* (2025.01); *H10D 62/157* (2025.01)

(58) Field of Classification Search
CPC . H10D 12/411–491; H10D 30/65–659; H10D 62/109–111
See application file for complete search history.

(56) References Cited

U.S. PATENT DOCUMENTS

2021/0202694 A1* 7/2021 Imasaka ............... H10D 62/106

FOREIGN PATENT DOCUMENTS

JP 2021-103731 A 7/2021

* cited by examiner

*Primary Examiner* — Daniel P Shook
(74) *Attorney, Agent, or Firm* — Studebaker Brackett PLLC

(57) ABSTRACT

A semiconductor device includes a semiconductor substrate of a first conductivity type, a RESURF layer of a second conductivity type, a buried layer of the second conductivity type formed in the bottom portion of a high-side circuit, and a MOSFET having the RESURF layer serving as a drift layer, in which the MOSFET includes a first semiconductor layer of the second conductivity type serving as a drain layer, an end portion of the first semiconductor layer is located on a low-side circuit side more than an end portion of the buried layer is, and a curvature center of a curved portion of the first semiconductor layer is located closer to a high-side circuit than a curved portion of the buried layer is, and the curvature of the curved portion of the first semiconductor layer is smaller than that of the curved portion of the buried layer.

5 Claims, 20 Drawing Sheets

F I G. 5
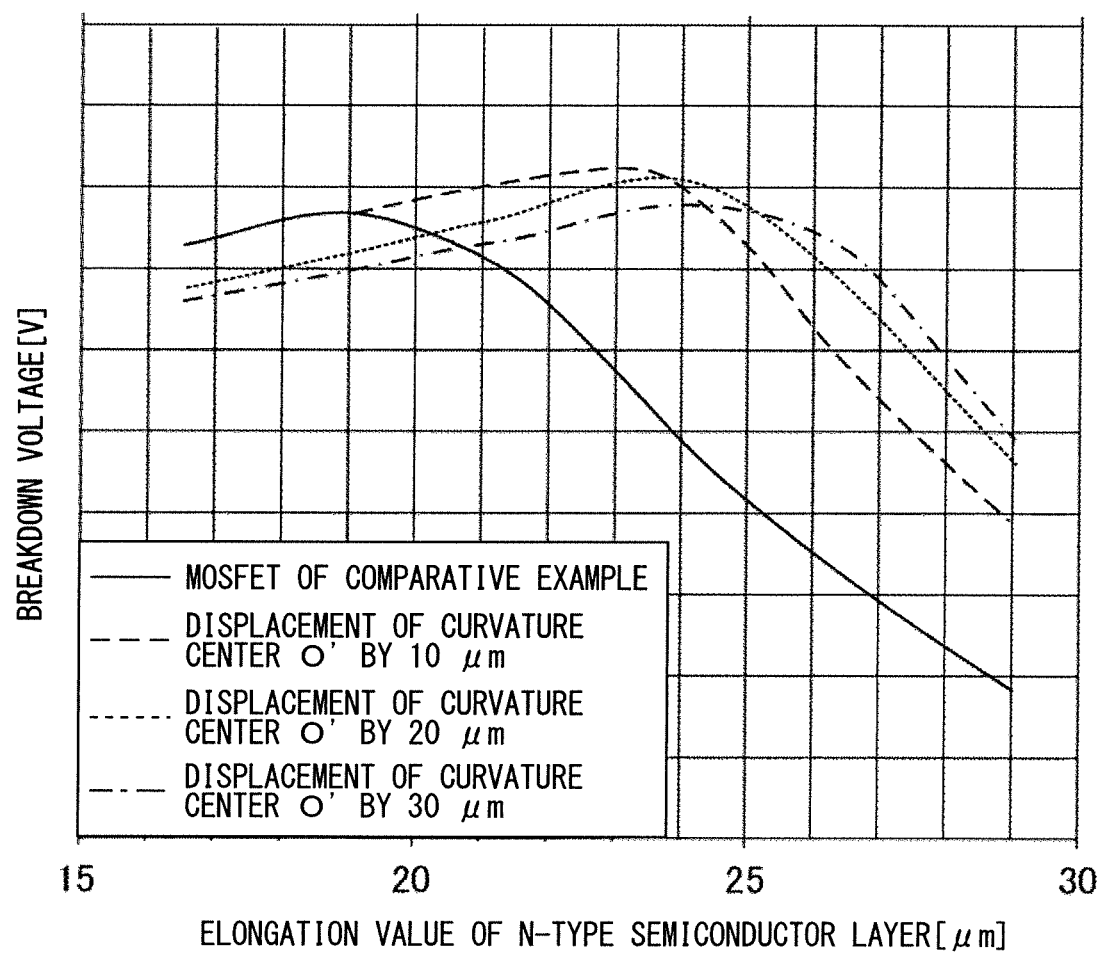

F I G. 1 1
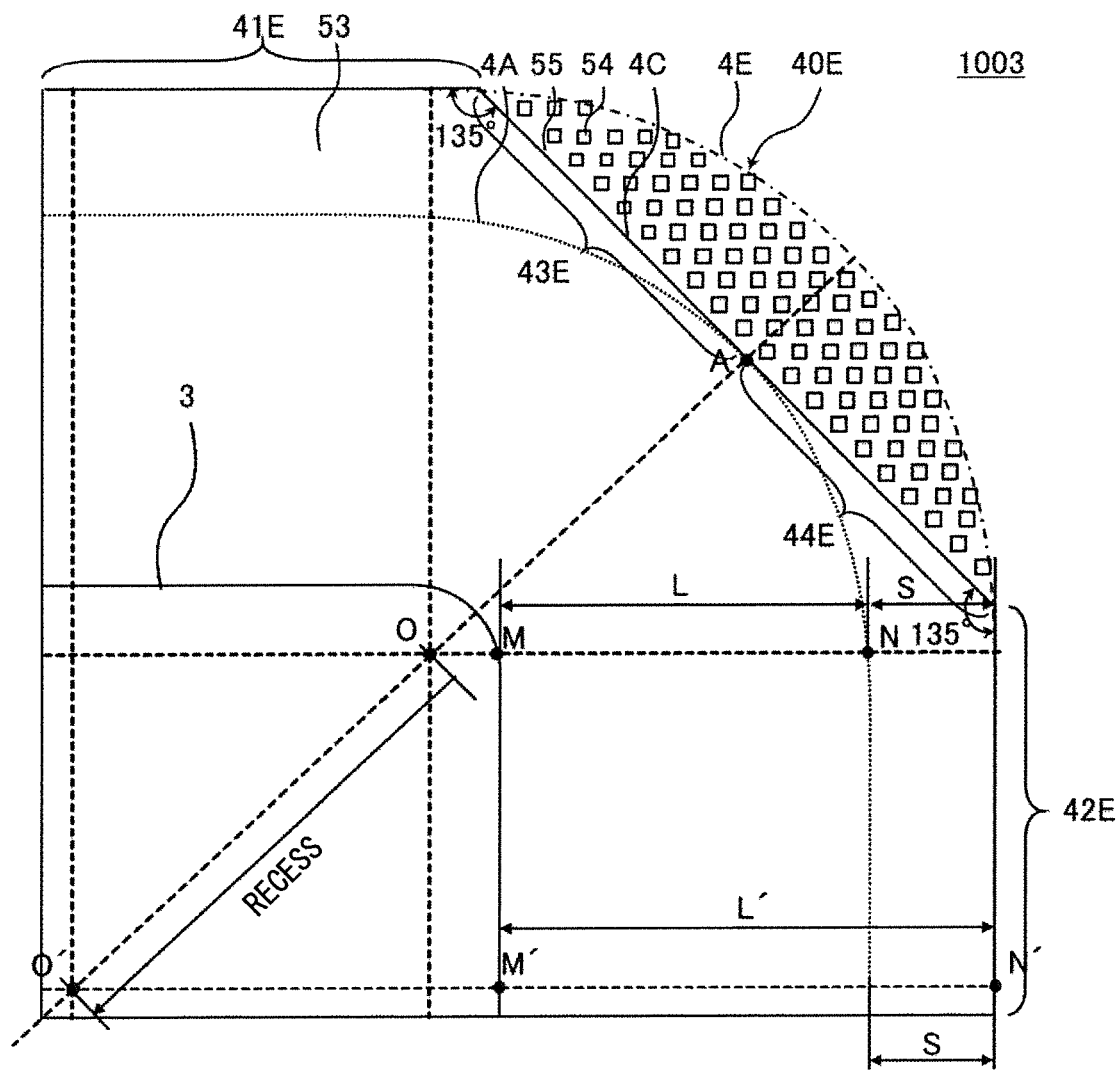

SEMICONDUCTOR DEVICE AND METHOD OF MANUFACTURING SEMICONDUCTOR DEVICE

FIELD OF THE INVENTION

The present disclosure relates to a semiconductor device including a Metal-Oxide-Semiconductor Field-Effect-Transistor (MOSFET) and a method of manufacturing the semiconductor device.

DESCRIPTION OF THE BACKGROUND ART

A power control IC (Integrated Circuit), which is mainly used to drive the gate of a power semiconductor device, outputs a drive signal according to the input signal from the input terminal, from an output terminal thereof, which drives the gate of a power switching element by turning on and off. A power control IC typically has a low-side circuit that operates with the ground (GND) potential as a reference potential, a high-side circuit that operates with a potential different from the GND potential as a reference potential, and a level shift circuit that performs signal transmission between the low-side circuit and the high-side circuit.

In particular, the power control IC requires a power source to drive both the low-side and high-side circuits. A technique of using a MOSFET formed in a RESURF layer as a high-voltage element in a bootstrap circuit with the bootstrap circuit for generating the power source for the high-side circuit within the IC is known.

In a semiconductor device with such a RESURF layer, the impurity concentration of the RESURF layer is limited because the RESURF layer is required to be fully depleted to maintain a high breakdown voltage during the breakdown voltage is maintained, which is a state from when an electric field is generated by applying a high voltage between the source and the drain when the MOSFET is turned off to when the avalanche starts. On the other hand, limiting the impurity concentration of the RESURF layer prevents reduction in the on-resistance of the MOSFET formed in the RESURF layer. For example, increasing the length of the RESURF layer forming the MOSFET in the direction along the substrate plane improves the breakdown voltage property of the MOSFET, but causes an increase in the on-resistance of the MOSFET. In other words, in the MOSFET formed in the RESURF layer, improvement in breakdown voltage property and reduction in on-resistance are in a trade-off relationship.

Therefore, techniques for improving the trade-off between the improvement in breakdown voltage property and the reduction in on-resistance are being studied. For example, in Japanese Patent Application Laid-Open No. 2021-103731, the trade-off between the improvement in the breakdown voltage property and the reduction in on-resistance in the MOSFET formed in the RESURF layer is improved with the structure in which an N-type buried diffusion layer and an N-type diffusion layer are provided, and the position of the end portion on the outer side (low side circuit side) of the N-type diffusion layer is laid closer to the low-side circuit than the end portion of the position of the outer side of the N-type buried diffusion layer is.

According to the semiconductor device disclosed in Japanese Patent Application Laid-Open No. 2021-103731, by extending the N-type diffusion layer toward the low-side circuit side more than the N-type buried diffusion layer is extended, the trade-off between the improvement in breakdown voltage property and the reduction in on-resistance is improved. On the other hand, in the N-type diffusion layer having a straight line region and a corner region in plan view, there has been a problem in that, when the extension of the N-type diffusion layer in the straight line region is similarly applied to the corner region, the electric field concentrates in the corner region and the breakdown voltage property reduces.

SUMMARY

An object of the present disclosure is to provide a semiconductor device with a reduction in breakdown voltage property.

According to a first aspect of the present disclosure, a semiconductor device includes a semiconductor substrate of a first conductivity type, a RESURF layer of a second conductivity type formed in a surface portion of the semiconductor substrate and separating a high-side circuit and a low-side circuit, a buried layer provided between the semiconductor substrate and the RESURF layer, formed at a bottom of the high-side circuit and having an impurity concentration higher than that of the RESURF layer, and a MOSFET having the RESURF layer serving as a drift layer. The MOSFET includes a first semiconductor layer of the second conductivity type formed in a surface portion of the RESURF layer having an impurity concentration higher than that of the RESURF layer, and serving as a drift layer, a second semiconductor layer of the first conductivity type provided on a side away from the high-side circuit further than the first semiconductor layer is, and a third semiconductor layer of the second conductivity type formed in a surface portion of the second semiconductor layer, and serving as a source layer. An end portion of the first semiconductor layer is located at a position further away from the high-side circuit than an end portion of the buried layer is. The end portion of the buried layer has a first straight portion, a second straight portion, and a curved portion whose ends are connected to the first straight portion and the second straight portion, respectively, in plan view. The end portion of the first semiconductor layer has a third straight portion, a fourth straight portion, and a curved portion whose ends are connected to the third straight portion and the fourth straight portion, respectively, in plan view. A position of a curvature center of the curved portion of the first semiconductor layer is closer to the high-side circuit than the curved portion of the buried layer is. A curvature of the curved portion of the first semiconductor layer is smaller than the curved portion of the buried layer.

According to a second aspect of the present disclosure, a semiconductor device includes a semiconductor substrate of a first conductivity type, a RESURF layer of a second conductivity type formed in a surface portion of the semiconductor substrate and separating a high-side circuit and a low-side circuit, a buried layer provided between the semiconductor substrate and the RESURF layer, formed at a bottom of the high-side circuit and having an impurity concentration higher than that of the RESURF layer, and a MOSFET having the RESURF layer serving as a drift layer. The MOSFET includes a first semiconductor layer of the second conductivity type formed in a surface portion of the RESURF layer having an impurity concentration higher than that of the RESURF layer, and serving as a drift layer, a second semiconductor layer of the first conductivity type provided on a side away from the high-side circuit further than the first semiconductor layer is, and a third semiconductor layer of the second conductivity type formed in a surface portion of the second semiconductor layer, and serving as a source layer. An end portion of the first semiconductor layer is located at a position further away from the high-side circuit than an end portion of the buried layer is. The end portion of the first semiconductor layer has a first straight portion, a second straight portion, and a portion whose ends are connected to the first straight portion and the second straight portion, respectively, in plan view. The portion has a third straight portion connected to the first straight portion at an obtuse angle and a fourth straight portion connected to the second straight portion at an obtuse angle, respectively, in plan view. The end portion of the buried layer has a fifth straight portion, a sixth straight portion, and a curved portion whose ends are connected to the fifth straight portion and the sixth straight portion, respectively, in plan view.

According to a third aspect of the present disclosure, a semiconductor device includes a semiconductor substrate of a first conductivity type, a RESURF layer of a second conductivity type formed in a surface portion of the semiconductor substrate and separating a high-side circuit and a low-side circuit, a buried layer provided between the semiconductor substrate and the RESURF layer, formed at a bottom of the high-side circuit and having an impurity concentration higher than that of the RESURF layer, and a MOSFET having the RESURF layer serving as a drift layer. The MOSFET includes a first semiconductor layer of the second conductivity type formed in a surface portion of the RESURF layer having an impurity concentration higher than that of the RESURF layer, and serving as a drift layer, a second semiconductor layer of the first conductivity type provided on a side away from the high-side circuit further than the first semiconductor layer is, and a third semiconductor layer of the second conductivity type formed in a surface portion of the second semiconductor layer, and serving as a source layer. An end portion of the first semiconductor layer is located at a position further away from the high-side circuit than an end portion of the buried layer is. The end portion of the buried layer has a first straight portion, a second straight portion, and a curved portion whose ends are connected to the first straight portion and the second straight portion, respectively, in plan view. The end portion of the first semiconductor layer has a third straight portion, a fourth straight portion, and a curved portion whose ends are connected to the third straight portion and the fourth straight portion, respectively, in plan view. An impurity concentration of a portion of the first semiconductor layer located on an inner side than the second curved portion including the second curved portion is lower than an impurity concentration of the first semiconductor layer.

According to the present disclosure, a method of manufacturing a semiconductor device is a method of manufacturing a semiconductor device that includes a semiconductor substrate of a first conductivity type, a RESURF layer of a second conductivity type formed in a surface portion of the semiconductor substrate and separating a high-side circuit and a low-side circuit, a buried layer provided between the semiconductor substrate and the RESURF layer, formed at a bottom of the high-side circuit and having an impurity concentration higher than that of the RESURF layer, and a MOSFET having the RESURF layer serving as a drift layer. The MOSFET includes a first semiconductor layer of the second conductivity type formed in a surface portion of the RESURF layer having an impurity concentration higher than that of the RESURF layer, and serving as a drift layer, a second semiconductor layer of the first conductivity type provided on a side away from the high-side circuit further than the first semiconductor layer is, and a third semiconductor layer of the second conductivity type formed in a surface portion of the second semiconductor layer, and serving as a source layer. An end portion of the first semiconductor layer is located at a position further away from the high-side circuit than an end portion of the buried layer is. The end portion of the buried layer has a first straight portion, a second straight portion, and a curved portion whose ends are connected to the first straight portion and the second straight portion, respectively, in plan view. The end portion of the first semiconductor layer has a third straight portion, a fourth straight portion, and a curved portion whose ends are connected to the third straight portion and the fourth straight portion, respectively, in plan view. In the method of manufacturing the semiconductor device, a step of forming the first semiconductor layer includes a step of forming a mask material having a first impurity implantation opening, a plurality of second impurity implantation openings, and a blocking portion defining the first impurity implantation opening and the plurality of second impurity implantation openings on a base material, a step of introducing impurities into the base material from the first impurity implantation opening and the plurality of second impurity implantation openings by irradiating with the impurities, a step of removing the mask material from the base material, and a step of subjecting the base material into which the impurities have been introduced to heat treatment. The plurality of second impurity implantation openings are provided in a region corresponding to a portion of the first semiconductor layer located on an inner side than the second curved portion including the second curved portion in the mask material in plan view.

According to the present disclosure, a reduction in breakdown voltage property is prevented.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 5 is a graph illustrating the relationship between the change in the elongation value S of the N-type semiconductor layer and the breakdown voltage between the source and the drain in a semiconductor device of a comparative example and the semiconductor device according to the first embodiment;

FIG. 11 is a plan view illustrating the schematic configuration of the semiconductor device according to the third embodiment;

DESCRIPTION OF THE PREFERRED EMBODIMENTS

In FIGS. 1, 6, 9 and 14, the direction to the left is referred to as "inner side" for convenience, and the direction to the right is referred to as "outer side" for convenience. Also, in FIGS. 3, 4, 7, 8, 10 to 13, and 15 to 19, the left and downward directions are referred to as "inner side" and the right and upward directions are referred to as "outer side".

As will be understood from the description below, the inner side in each drawing corresponds to a side closer to a high-side circuit, and the outer side corresponds to a side away from the high-side circuit.

First Embodiment

A semiconductor device 1001 according to a first embodiment will be described with reference to FIGS. 1 to 6.

Figure 1:
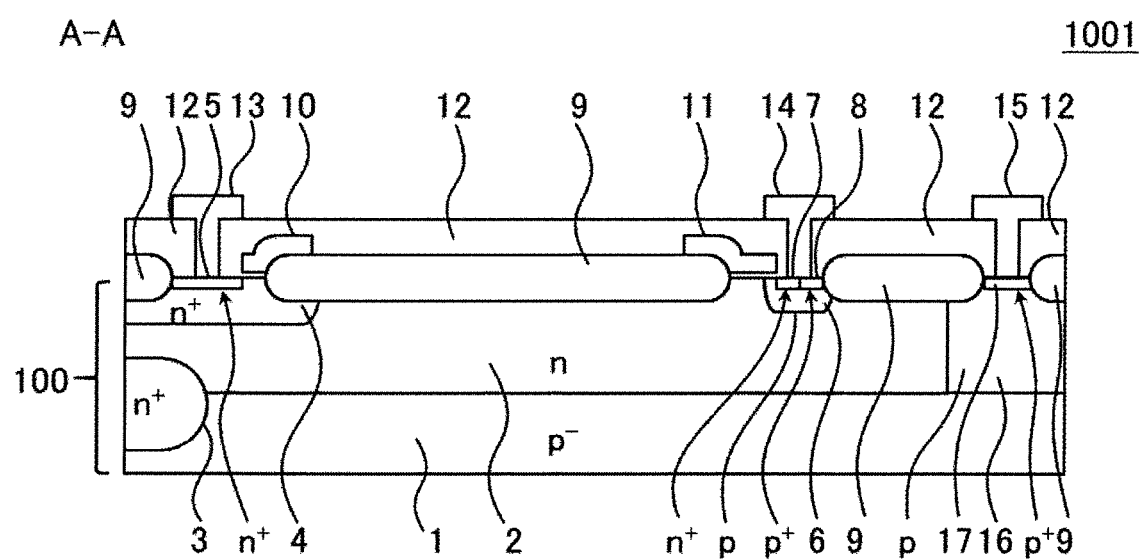
FIG. 1 is a cross-sectional view illustrating a schematic configuration of a semiconductor device according to a first embodiment.

FIG. 1 is a cross-sectional view illustrating a structure of a semiconductor device 1001 according to a first embodiment, and corresponds to a cross-section taken along line A-A in FIG. 2 described later. The semiconductor device 1001 includes a MOSFET formed in a RESURF layer 2. Hereinafter, the MOSFET refers to a lateral N-channel MOSFET formed in the RESURF layer 2. In the following, P-type represents the first conductivity type, N-type represents the second conductivity type, and the semiconductor layer of the first conductivity type is referred to as "P-type semiconductor layer", and the semiconductor layer of the second conductivity type is referred to as "N-type semiconductor layer". However, the first conductivity type may be N-type, and the second conductivity type may be P-type.

The semiconductor device 1001 includes a semiconductor layer 100. The semiconductor layer 100 includes a P-type semiconductor substrate 1, a RESURF layer 2, which is an N-type semiconductor layer formed in the surface portion of the semiconductor substrate, and a buried layer 3, which is provided between the semiconductor substrate 1 and the RESURF layer 2 and formed at the bottom of a high-side circuit to be described later, having an impurity concentration higher than that of the RESURF layer 2. The semiconductor layer 100 includes an N-type semiconductor layer 4 formed in the surface portion of the RESURF layer 2 and having an impurity concentration higher than that of the RESURF layer 2, and an N-type semiconductor layer 5 formed in the surface portion of the N-type semiconductor layer 4 and having an impurity concentration higher than that of the N-type semiconductor layer 4. The semiconductor layer 100 includes a P-type semiconductor layer 6 formed on the outer side than the N-type semiconductor layer 4 is, an N-type semiconductor layer 7 formed in the surface portion of the P-type semiconductor layer 6, and a P-type semiconductor layer 8 provided in the surface portion of the P-type semiconductor layer 6 and having an impurity concentration higher than that of the P-type semiconductor layer 6. The semiconductor layer 100 further includes a P-type semiconductor layer 16 being on the outer side than the RESURF layer 2 is and formed in the surface portion of the semiconductor substrate 1 so as to be in contact with the RESURF layer 2, and a P-type semiconductor layer 17 formed in the surface portion of P-type semiconductor layer 16 and having an impurity concentration higher than that of P-type semiconductor layer 16.

The impurity concentrations of N-type semiconductor layers increase in the order of the RESURF layer 2, the N-type semiconductor layer 4, the buried layer 3, and the N-type semiconductor layer 5, and the impurity concentration of the N-type semiconductor layer 7 is equal to that of the N-type semiconductor layer 5.

The semiconductor device 1001 includes an insulating film 12 provided on the semiconductor layer 100 and a field oxide film 9 provided, in a position between the N-type semiconductor layer 5 and the N-type semiconductor layer 7, in a position inner side than the N-type semiconductor layer 5 is, in a position between the P-type semiconductor layer 8 and the P-type semiconductor layer 17, and in a position outer side than the P-type semiconductor layer 17 is, on the surface of the semiconductor layer 100 so as to be covered with the insulating film 12. The semiconductor device 1001 includes a polysilicon 10 provided so as to cover the end portion on the inner side of the field oxide film 9 between the N-type semiconductor layer 5 and the N-type semiconductor layer 7, and a polysilicon 11 provided so as to cover the end portion on the outer side of the field oxide film 9 between the N-type semiconductor layer 5 and the N-type semiconductor layer 7. The semiconductor device 1001 further includes a drain electrode 12 connected to the N-type semiconductor layer 5, a source electrode 14 connected to the N-type semiconductor layer 7 and the P-type semiconductor layer 8, and an electrode for fixing reference potential 15 connected to the P-type semiconductor layer 17, each of which is formed so as to be buried in the insulating film 12. The polysilicon 10 is buried in the insulating film 12 and used as a mask material 56 at a moment of implantation at which the N-type semiconductor layer 5 is formed. The polysilicon 11 is buried in the insulating film 12 and used as the gate electrode of the MOSFET.

The semiconductor device 1001 constitutes a high-voltage integrated circuit, or an HVIC, and includes a high-side circuit and low-side circuit. Both of the high-side circuit and the low-side circuit are configured in N-type semiconductor layers and P-type semiconductor layers that are not illustrated in FIG. 1 in the semiconductor layer 100. The high-side circuit, which includes a digital circuit and an analog circuit, generates a signal that drives a power semiconductor element to supply thereof to the high-side power semiconductor element. The low-side circuit, which includes a digital circuit and an analog circuit, generates a signal that drives a power semiconductor element to supply thereof to the low-side power semiconductor element. The power semiconductor element is, for example, a MOSFET or an (Insulated Gate Bipolar Transistor (IGBT), and is provided outside the semiconductor device 1001.

The semiconductor substrate 1 and the semiconductor layer 100 include a semiconductor material such as silicon (Si) or silicon carbide (SiC). In particular, the semiconductor device 1001 using silicon carbide or the like, which has a wider bandgap than silicon, is superior in operation at high voltage and high temperature to conventional semiconductor device 1001 using silicon.

The RESURF layer 2 separates the high-side circuit and the low-side circuit. In addition to this, the RESURF layer 2 serves as a drift layer of the MOSFET.

The buried layer 3 illustrates the effect of suppressing the vertical parasitic operation of the element in the high-side circuit, and the effect of preventing the damage from being inflicted on the operation of the elements within the high-side circuit with the depletion layer of the RESURF layer 2 expanding into the high-side circuit when the breakdown voltage is maintained.

The N-type semiconductor layer 4 has a structure in which the position of the end portion on the outer side of the N-type semiconductor layer 4 is away from the high-side circuit than the position of the end portion on the outer side of the buried layer 3 is, and this illustrates the effect of reducing the on-resistance and the effect of preventing field inversion of the MOSFET. In addition, the N-type semiconductor layer 4 and the N-type semiconductor layer 5 serve as drain layers of the MOSFET, and the N-type semiconductor layer 5 serves to electrically connect the N-type semiconductor layer 4 and a drain electrode 13. Although the buried layer 3 and the N-type semiconductor layer 4 are spaced apart in the first embodiment, they may be in contact with each other.

The P-type semiconductor layer 6 serves as a back gate layer of the MOSFET, the N-type semiconductor layer 7 serves as a source layer of the MOSFET, and the P-type semiconductor layer 8 serves to electrically connect the P-type semiconductor layer 6 and a source electrode 14, a substitute for a back gate electrode.

The P-type semiconductor layer 16, which is the outer end portion of the semiconductor device 1001, serves to fix the potential of the semiconductor substrate 1 to a reference potential. The P-type semiconductor layer 17 serves to electrically connect the P-type semiconductor layer 16 and the electrode for fixing reference potential 15.

Figure 2:
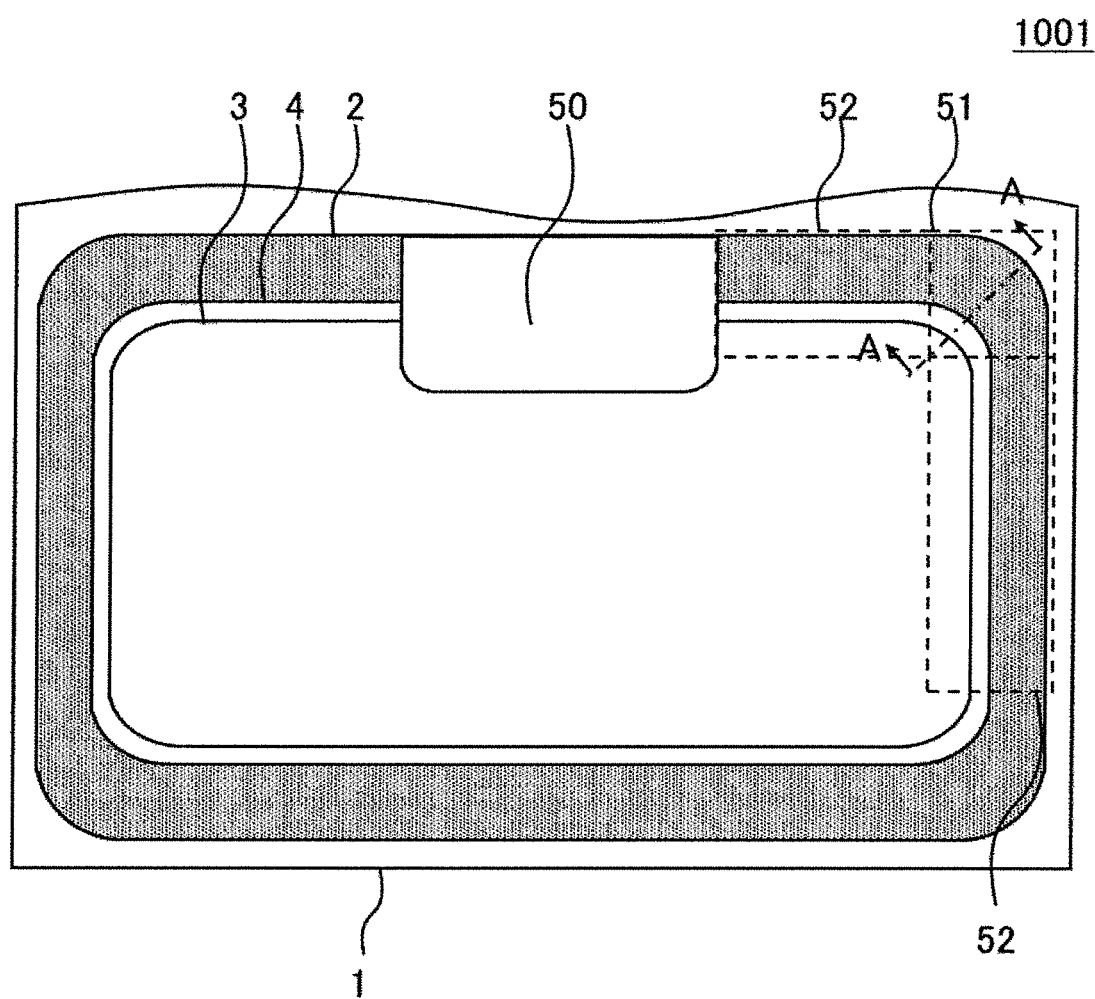
FIG. 2 is a plan view illustrating the schematic configuration of the semiconductor device according to the first embodiment.

FIG. 2 is a plan view illustrating a semiconductor device 1001 of the first embodiment.

In FIG. 2, the outermost edge is represented by the outer edge of the semiconductor substrate 1, that is, the outer edge of the semiconductor device 1001. A semiconductor device 1001 includes a level shift circuit 50 that transmits signals between the high-side circuit and the low-side circuit.

The N-type semiconductor layer 4 illustrated in FIG. 2 is a portion that does not overlap the buried layer 3 in plan view, and the non-overlapping portion is formed in a ring with the level shift circuit 50 interposed therebetween. The RESURF layer 2 illustrated in FIG. 2 is a portion that does not overlap the buried layer 3, the N-type semiconductor layer 4, and the N-type semiconductor layer 5 in plan view, and the non-overlapping portion is also formed in a ring with the level shift circuit 50 interposed therebetween.

The outer edges of each layer of the RESURF layer 2, the N-type semiconductor layer 4, and the buried layer 3 forms a substantially rectangular shape with four corners. Each corner has a curved portion each of whose ends is connected to a straight portion. These two straight portions correspond to two adjacent sides of the substantially rectangular shape. In each layer of the RESURF layer 2, the N-type semiconductor layer 4, and the buried layer 3, a corner area represents the area of the inner side of the curved portion including the curved portion, and a straight area represents the area of the inner side of the straight portion including the straight portion of each side. In FIG. 2, a corner area 51 represents one of four corner areas, and two straight areas each represent two straight areas adjacent to the corner area 51.

The high-side circuitry is arranged within the buried layer 3 in FIG. 2. The low-side circuit is arranged aligned with the high-side circuit with the RESURF layer 2 and the level shift circuit 50 interposed therebetween, specifically, the low-side circuit is arranged above the RESURF layer 2 and the level shift circuit 50 (not illustrated).

The MOSFET according to the first embodiment, which is provided in the RESURF layer 2 (shaded portion in FIG. 2) and surrounding the high-side circuit, is an element constituting the bootstrap circuit, and is used instead of the bootstrap diode. A bootstrap circuit is a circuit that generates an operating power source for a high-side circuit, and includes, in addition to a MOSFET, a capacitor connected to the MOSFET.

Figure 3:
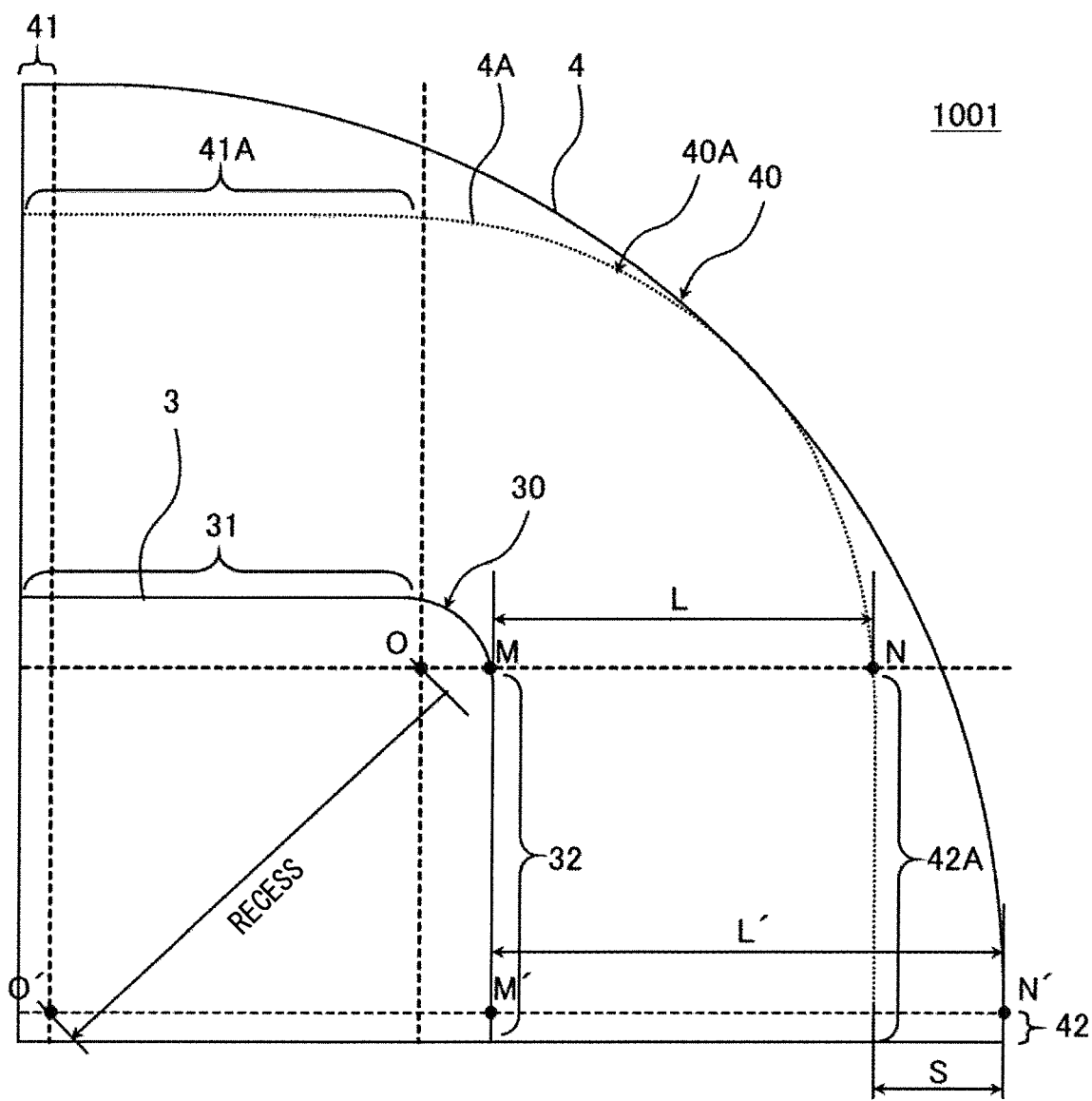
FIG. 3 is a plan view illustrating the schematic configuration of the semiconductor device according to the first embodiment.

FIG. 3 is a plan view illustrating part of the corner area 51 and the straight areas 52 of the first embodiment.

FIG. 3 is an enlarged view of the buried layer 3 and the N-type semiconductor layer 4 in the corner area 51 illustrated in FIG. 2.

Solid lines represent contour lines that are the respective end portions of the buried layer 3 and the N-type semiconductor layer 4. The end portion of the N-type semiconductor layer 4 is defined by a straight portion 41 included in one straight area 52, a straight portion 42 included in an other straight area 52, and a curved portion 40 whose ends are connected to the straight portion 41 and the straight portion 42, respectively. The straight portion 41 and the straight portion 42 are orthogonal to each other in their extension lines. The end portion of the buried layer 3 is also defined by a straight portion 31 included in one straight area 52, a straight portion 32 included in an other straight area 52, and a curved portion 30 whose ends are connected to the straight portion 31 and the straight portion 32, respectively. The straight portion 31 and the straight portion 32 are orthogonal to each other in their extension lines. Therefore, the straight portion 41 and the straight portion 31 are parallel, and the straight portion 42 and the straight portion 31 are also parallel.

The curvature center O of the curved portion 30 of the buried layer 3 and the curvature center O' of the curved portion 40 of the N-type semiconductor layer 4 are located at different positions, and the curvatures of the two are also different. The distance between the contour line of the buried layer 3 and the contour line of the N-type semiconductor layer 4 is not the same value in the corner area 51 and the straight area 52.

Meanwhile, the dotted line represents the contour line of the outer edge of an N-type semiconductor layer 4A as a comparative example. The end portion of the N-type semiconductor layer 4A is defined by a straight portion 41A included in one straight area 52, a straight portion 42A included in an other straight area 52, and a curved portion 40A whose ends are connected to the straight portion 41A and the straight portion 42A, respectively. The straight portion 41A and the straight portion 42A are orthogonal to each other in their extension lines. The curvature center of the curved portion 40A of the N-type semiconductor layer 4A and the curvature center O of the curved portion 30 of the buried layer 3 are located at the same positions, and the curvatures of the two are also different. The distance between the contour line of the buried layer 3 and the contour line of the N-type semiconductor layer 4A is the same value in the corner area 51 and the straight area 52.

The distance between a point on the contour line of the buried layer 3 and the contour line of the N-type semiconductor layer 4 is represented by the distance from the point to a point on the contour line of the N-type semiconductor layer 4 where a line orthogonal to the tangent line at the point intersects.

As illustrated in FIG. 3, the curvature of the curved portion 40 of the N-type semiconductor layer 4 is smaller than the curvature of the curved portion 30 of the buried layer 3, and the curvature center O' of the curved portion 40 of the N-type semiconductor layer 4 is receded toward the inner side in comparison with the curvature center O of the curved portion 30 of the buried layer 3.

Figure 4:
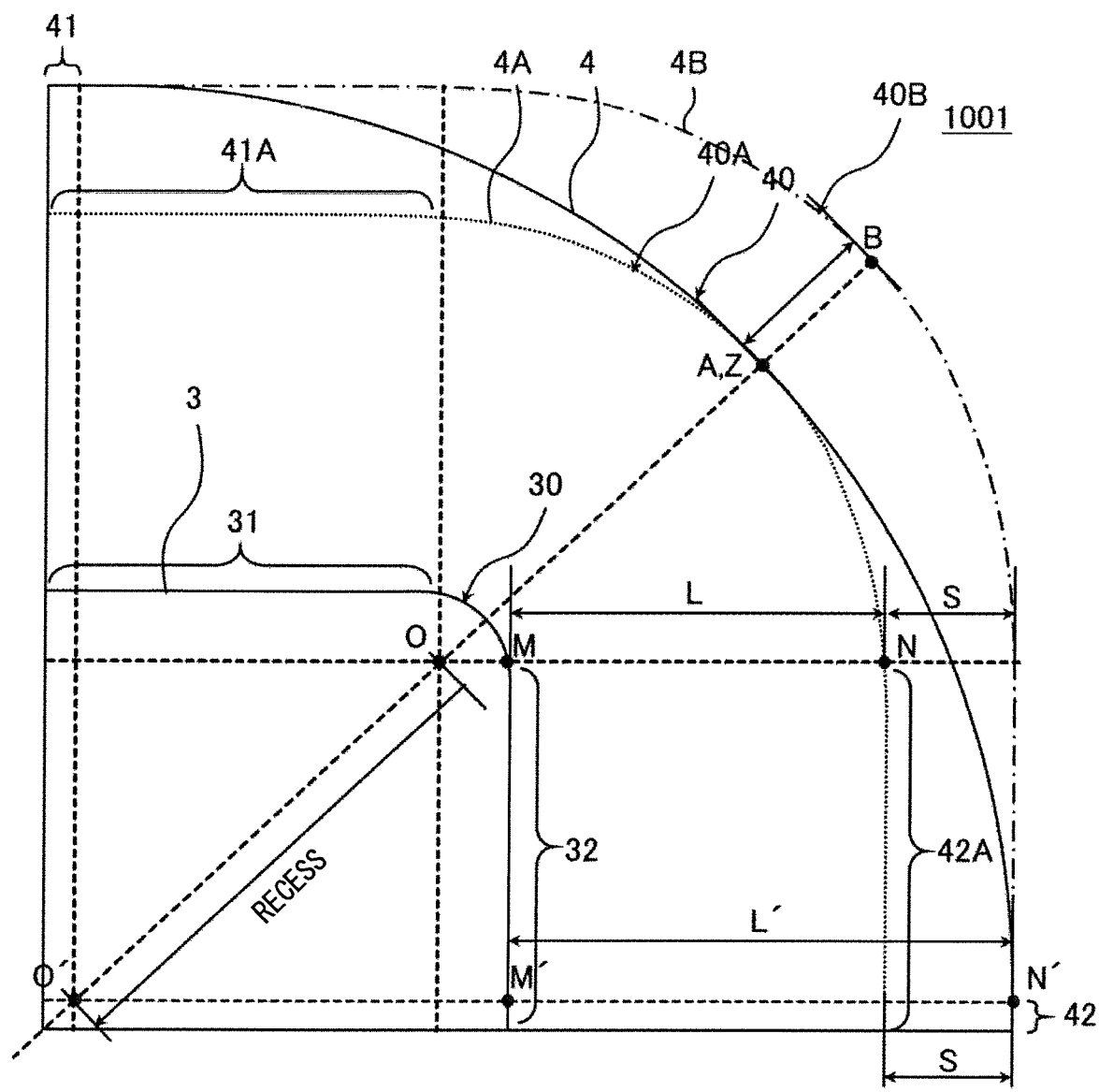
FIG. 4 is a plan view illustrating the schematic configuration of the semiconductor device according to the first embodiment.

Further, a distance L' between an intersection point N' between the curved portion 40 and the straight portion 42 of the N-type semiconductor layer 4 and an intersection point M' between the straight line drawn in the horizontal direction from the intersection point N' and the contour line of the embedded layer 3, is made greater by the elongation value S illustrated in FIG. 3, than a distance L between an intersection point N between the curved portion 40A and the straight portion 42A of the N-type semiconductor layer 4 and an intersection point M between the straight line drawn in the horizontal direction from the intersection point N. Specifically, as illustrated in FIG. 4, a line segment AB is elongated by the elongation value S, in which an intersection point A represents an intersection point of between a straight line passing through the curvature center O and the curvature center O' and the curved portion 40A of the N-type semiconductor layer 4A, and an intersection point B represents an intersection point of between a straight line passing through the curvature center O and the curvature center O' and the curved portion 40B of the N-type semiconductor layer 4B. Here, the elongation value S refers to the horizontal distance between the intersection point N and the intersection point N' between the corner area 51 and the straight area 52 of the N-type semiconductor layer 4.

FIG. 3 particularly illustrates the case where, in the corner area 51, at a point, which is a point on the contour line of the N-type semiconductor layer 4 at which the distance between the curvature center O and the point becomes shortest, the contour line of the N-type semiconductor layer 4 and the contour line of the N-type semiconductor layer 4A are in contact with each other.

Although the corner area 51 has been described, the same configuration as in FIG. 3 is applicable to the shapes of the other three corner areas.

FIG. 4 is a plan view in which an N-type semiconductor layer 4B is superimposed on FIG. 3 as another comparative example. A dashed line indicates the N-type semiconductor layer 4B, and the distance L from the buried layer 3 is extended by the elongation value S. However, unlike the N-type semiconductor layer 4A, the curvature center thereof remains at the same position as the curvature center of the curved portion 40A of the N-type semiconductor layer 4A, and the distance L is extended by the elongation value S, as illustrated in FIG. 4.

Therefore, the corner area 51 of the N-type semiconductor layer 4B is elongated more, by the elongation value S, than that of the N-type semiconductor layer 4A as a whole, similarly to the straight areas 52.

Effects of the semiconductor device 1001 according to a first embodiment will be described.

In the semiconductor device 1001 according to the first embodiment, when the breakdown voltage is maintained, while at least the portion of the RESURF layer 2 on the outer side the N-type semiconductor layer 4 is fully depleted so that a high breakdown voltage of the MOSFET is realized, the buried layer 3 prevents the damage from being inflicted on the operation of the elements within the high-side circuit with the depletion layer generated from a PN junction between the semiconductor substrate 1 and the RESURF layer 2 expanding into the high-side circuit. The buried layer 3 also serves to suppress the operation of vertical parasitic PNP transistors in the high-side circuit. Also, by providing the N-type semiconductor layer 4 having the impurity concentration higher than that of the RESURF layer 2, which serves as a drift layer, in the surface portion of the RESURF layer 2, the surface concentration is improved and the on-resistance of the MOSFET is reduced.

Furthermore, both the buried layer 3 and the N-type semiconductor layer 4 being formed within the RESURF layer 2 does not allow the full depletion of the buried layer 3 when the breakdown voltage is maintained; therefore, the concentration of electric field that occurs in the buried layer 3 is dispersed by the buried layer 3 and the N-type semiconductor layer 4, improving the breakdown voltage property of the MOSFET.

These effects are exhibited also in the semiconductor device having the N-type semiconductor layer 4A according to the comparative example. Here, assume that the N-type semiconductor layer 4A is elongated to become the N-type semiconductor layer 4B in order to further reduce the on-resistance of the MOSFET. Then, not only the straight areas 52 but also the corner area 51 of the N-type semiconductor layer 4B are elongated more by the elongation value S than the N-type semiconductor layer 4A as a whole. Accordingly, although the on-resistance is reduced more as compared with the case of the N-type semiconductor layer 4A, the electric field tends to be concentrated in the corner area 51 of the N-type semiconductor layer 4B, deteriorating the breakdown voltage property.

Meanwhile, also in the present embodiment, the N-type semiconductor layer 4A is elongated to become the N-type semiconductor layer 4, that is, the on-resistance of the MOSFET is reduced because the distance L of the N-type semiconductor layer 4A is increased by the elongation value S in the straight area 52.

In the first embodiment, the line segment AZ is smaller than the line segment AB when the intersection point of the straight line passing through the curvature center O and the curvature center O' and the curved portion 40 of the N-type semiconductor layer 4 is the intersection point Z; therefore, a concentration of electric field in the corner area 51 of the N-type semiconductor layer 4 is suppressed and a reduction in breakdown voltage property is prevented as compared with the N-type semiconductor layer 4B. Also, in the N-type semiconductor layer 4 as in the first embodiment, in comparison with the N-type semiconductor layer 4A, the curvature of the N-type semiconductor layer 4 in the corner region 51 is small so that the on-resistance can be reduced and the concentration of electric field of the N-type semiconductor layer 4 in the corner area 51 can also be suppressed.

FIG. 5 is a graph illustrating the relationship between the change in the elongation value S of the N-type semiconductor layer and the breakdown voltage between the source and the drain in the MOSFET of a comparative example and the MOSFET according to the first embodiment.

In FIG. 5, the solid line graph indicates a change in breakdown voltage when the elongation value S of the N-type semiconductor layer 4B of the comparative example is changed. The dashed line graph indicates a change in the breakdown voltage when the elongation value S is changed in a state where the curvature center O' of the curved portion 40 of the N-type semiconductor layer 4 of the first embodiment is displaced leftward and downward by 10 μm in FIG. 4. The dotted line graph indicates a change in the breakdown voltage when the elongation value S is changed in a state where the curvature center O' of the curved portion 40 of the N-type semiconductor layer 4 of the first embodiment is displaced leftward and downward by 20 μm in FIG. 4. The one dot chain line graph indicates a change in the breakdown voltage when the elongation value S is changed in a state where the curvature center O' of the curved portion 40 of the N-type semiconductor layer 4 of the first embodiment is displaced leftward and downward by 30 μm in FIG. 4. The evaluation was taken place with the distance L in the N-type semiconductor layer 4A serving as a reference being 21 μm.

As illustrated in FIG. 5, the peak value of the breakdown voltage of the MOSFET of the first embodiment is higher than that of the MOSFET of the comparative example, illustrating improvement in the breakdown voltage property of the MOSFET of the first embodiment in comparison with the MOSFET of the comparative example.

Furthermore, the elongation value S at the peak value of the breakdown voltage is 19 μm for the MOSFET of the comparative example, whereas the same are 23 μm, 24 μm, and 25 μm for the three examples of the MOSFET of the first embodiment. Therefore, the elongation value of the N-type semiconductor layer 4 of the MOSFET of the first embodiment can be increased compared with the MOSFET of the comparative example from which a reduction in on-resistance can also be expected.

In other words, in the MOSFET of the first embodiment, the trade-off between the improvement in breakdown voltage property and the reduction in on-resistance is improved in comparison with the conventional MOSFET.

Figure 6:
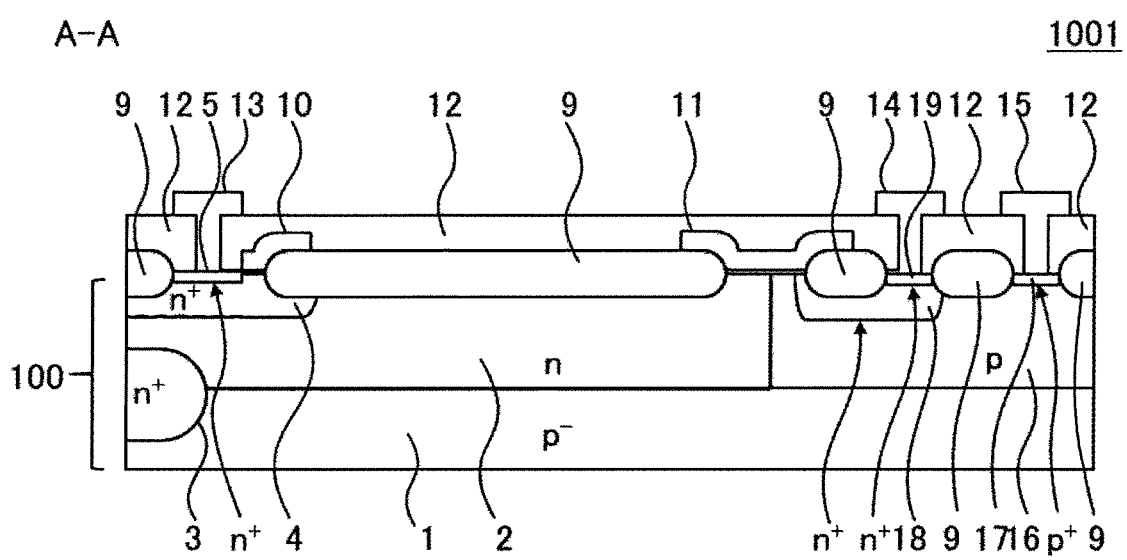
FIG. 6 is a cross-sectional view illustrating a schematic configuration of the semiconductor device according to the first embodiment.

In the first embodiment, although the example has been illustrated that the back gate layer of the MOSFET is composed of the P-type semiconductor layer 6, and the source electrode 14 substitutes for the back gate electrode, as illustrated in FIG. 6, the back gate layer may be formed with a P-type semiconductor layer 16, and the electrode for fixing reference potential 15 may substitute for the back gate electrode. At this time, an N-type semiconductor layer 18 is provided in the surface portion of the P-type semiconductor layer 16, and an N-type semiconductor layer 19 connected to the source electrode 14 is provided in the surface portion of the N-type semiconductor layer 18. The N-type semiconductor layer 18 and the N-type semiconductor layer 19 become source layers of the MOSFET. The impurity concentrations of the N-type semiconductor layer 18 and the N-type semiconductor layer 19 are the same as those of the N-type semiconductor layers 4 and 5, respectively.

Second Embodiment

Figure 7:
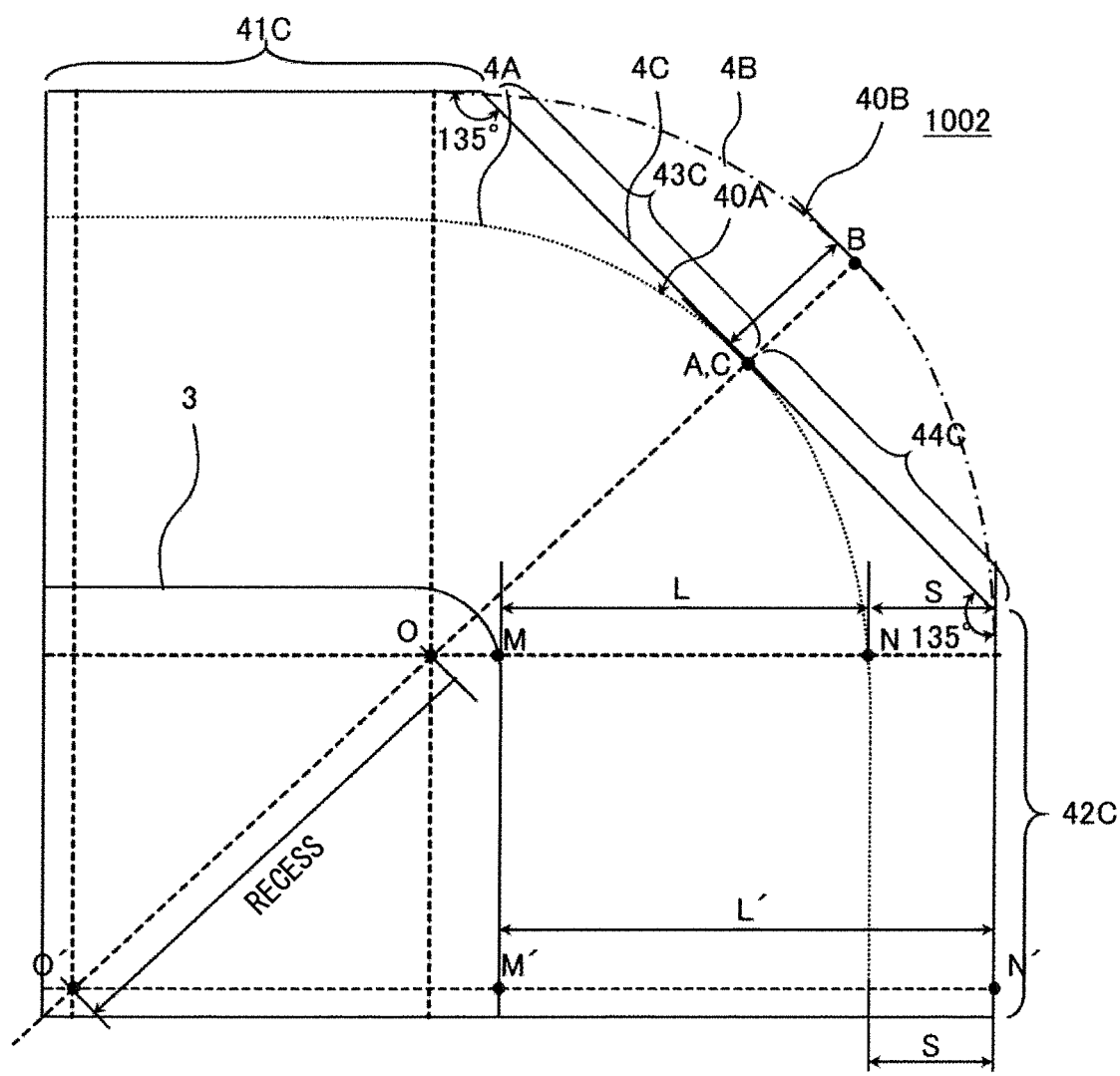
FIG. 7 is a plan view illustrating a schematic configuration of a semiconductor device according to a second embodiment.

FIG. 7 is a plan view illustrating part of a corner area 51 and linear areas 52 of the second embodiment.

In the first embodiment, the configuration has been described, in which, the curvature of the curved portion 40 of the N-type semiconductor layer 4 is smaller than the curvature of the curved portion 30 of the buried layer 3, and the curvature center O' of the curved portion 40 of the N-type semiconductor layer 4 is receded toward the inner side in comparison with the curvature center O of the curved portion 30 of the buried layer 3, meanwhile, the corner area 51 of the N-type semiconductor layer 4C has a shape in which the curved portion 40B of the N-type semiconductor layer 4B is chamfered, which is a different respect from the first embodiment. The rest of the configuration is the same as in the first embodiment, and the same reference numerals are given to the same or corresponding parts as in the first embodiment.

FIG. 7 is an enlarged view of the buried layer 3 and the N-type semiconductor layer 4 in the corner area 51 illustrated in FIG. 2.

The N-type semiconductor layer 4C indicated by a solid line represents a contour line of a shape obtained by chamfering the curved portion 40B of the N-type semiconductor layer 4B at the intersection point A. Although, the surface formed by chamfering the curved portion 40B of the N-type semiconductor layer 4B is in contact with the contour line of the curved portion 40A of the N-type semiconductor layer 4A, the surface may not be in contact therewith.

Figure 8:
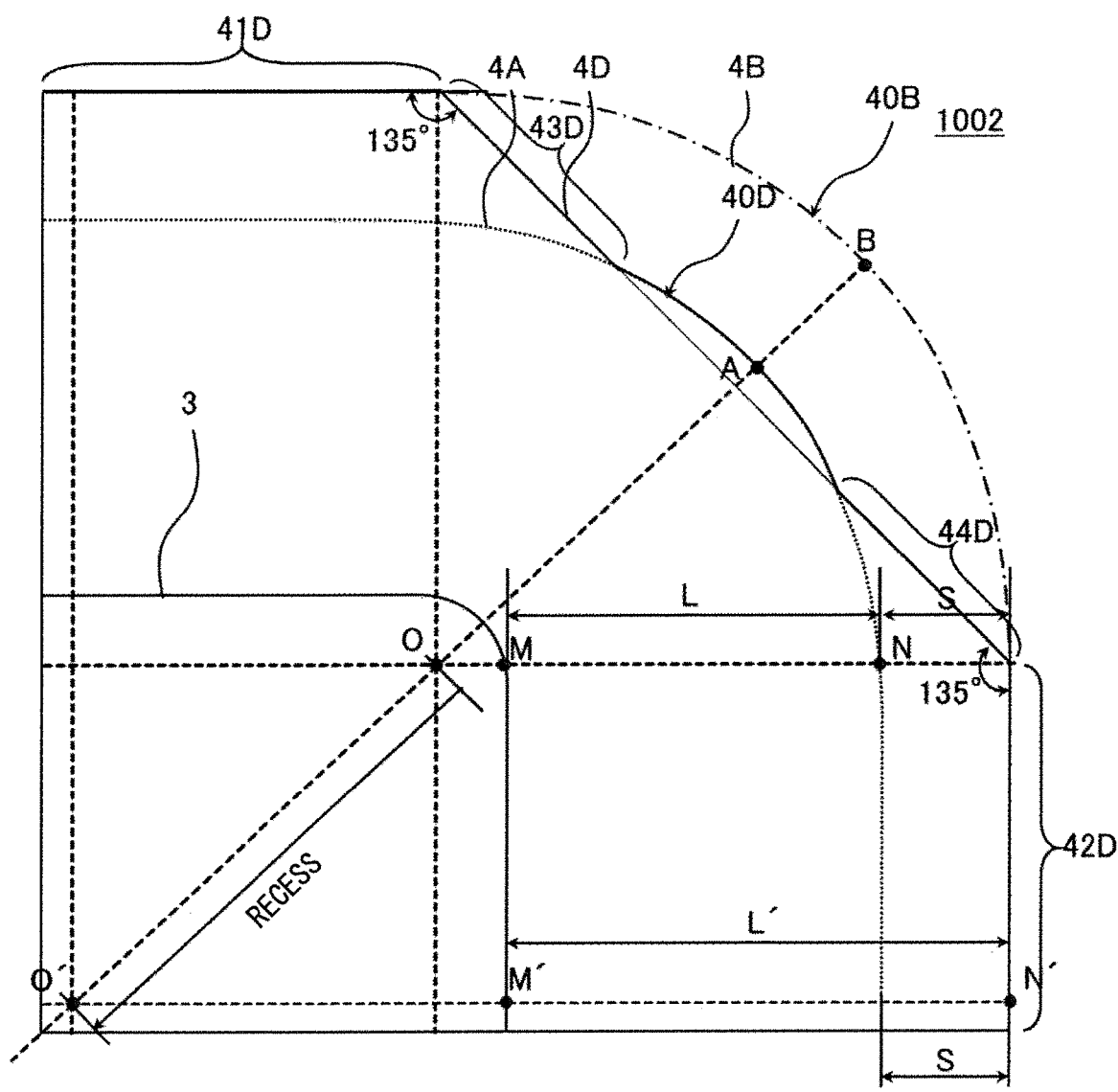
FIG. 8 is a plan view illustrating the schematic configuration of the semiconductor device according to the second embodiment.

FIG. 8 is a plan view illustrating an other example of part of the corner area 51 and the linear areas 52 of the second embodiment. As in an N-type semiconductor layer 4D illustrated in FIG. 8, the shape takes a form that is chamfered the curved portion 40B of the N-type semiconductor layer 4B with a portion of the contour line of the curved portion 40A of the N-type semiconductor layer 4A left such that a surface formed by chamfering the curved portion 40B of the N-type semiconductor layer 4B overlaps the contour line of the curved portion 40A of the N-type semiconductor layer 4A.

Although both FIGS. 7 and 8 illustrate the shapes chamfered the curved portion 40B of the N-type semiconductor layer 4B, the curved portion 40 of the N-type semiconductor layer 4 may be chamfered to form the N-type semiconductor layer 4C.

According to the second embodiment, in plan view, the N-type semiconductor layer has end portions that are a straight portion 41C or 41D, a straight portion 42C or 42D, and a portion each of both ends connect to the straight portion 41C or 41D and the straight portion 42C or 42D, in which the portion has a straight portion 43C or 43D connected to the straight portion 41C or 41D at an obtuse angle, and a straight portion 44C or 44D connected to the straight portion 42C or 42D.

In FIG. 7, one straight line is formed with the straight portion 43C and the straight portion 44C. The straight portion 41C and the straight portion 42C are in a relationship where they are orthogonal to each other on their extension lines, the straight portion 43C intersects the straight portion 41C at an angle of 135 degrees, and the straight portion 44C intersects the straight portion 42C at an angle of 135 degrees.

In FIG. 8, the portion further has a curved portion 40D each of both ends is connected to the straight portion 43D and the straight portion 44D. The straight portion 41D and the straight portion 42D are in a relationship where they are orthogonal to each other on their extension lines, the straight portion 43D intersects the straight portion 41D at an angle of 135 degrees, and the straight portion 44D intersects the straight portion 42D at an angle of 135 degrees.

In a semiconductor device 1002 of the second embodiment, when the N-type semiconductor layer 4A is elongated to become the N-type semiconductor layer 4C, the distance L of the N-type semiconductor layer 4A is increased by the elongation value S, so that the on-resistance is reduced. Further, the line segment AC is smaller than the line segment AB when the intersection point of the straight line passing through the curvature center O and the curvature center O' and the contour line of the curved portion 40C of the N-type semiconductor layer 4C is the intersection point C; therefore, a concentration of electric field in the corner area 51 of the N-type semiconductor layer 4 is suppressed and a reduction in breakdown voltage property is prevented as compared with the N-type semiconductor layer 4B.

Although the corner area 51 has been described in the N-type semiconductor layer illustrated in FIGS. 7 and 8, the same configuration as in FIG. 7 or 8 is applicable to the shapes of the other three corner areas.

Also, the back gate layer and the source layer of the second embodiment may be configured like the P-type semiconductor layer 16 and the N-type semiconductor layers 18 and 19 in FIG. 6.

Although the straight portion 43C is directly connected to the straight portion 41C in FIG. 7, a curved portion may be interposed between the straight portions 43C and 41C. Therefore, "a certain straight portion is connected to another straight portion at an obtuse angle" encompasses the case where two straight portions, whose extension lines intersect at an obtuse angle, are connected to each other via a curved portion. For example, the same applies between the straight portion 44C and the straight portion 42C in FIG. 7, between the straight portion 43D and the straight portion 41D and between the straight portion 44D and the straight portion 42D in FIG. 8.

Third Embodiment

Figure 9:
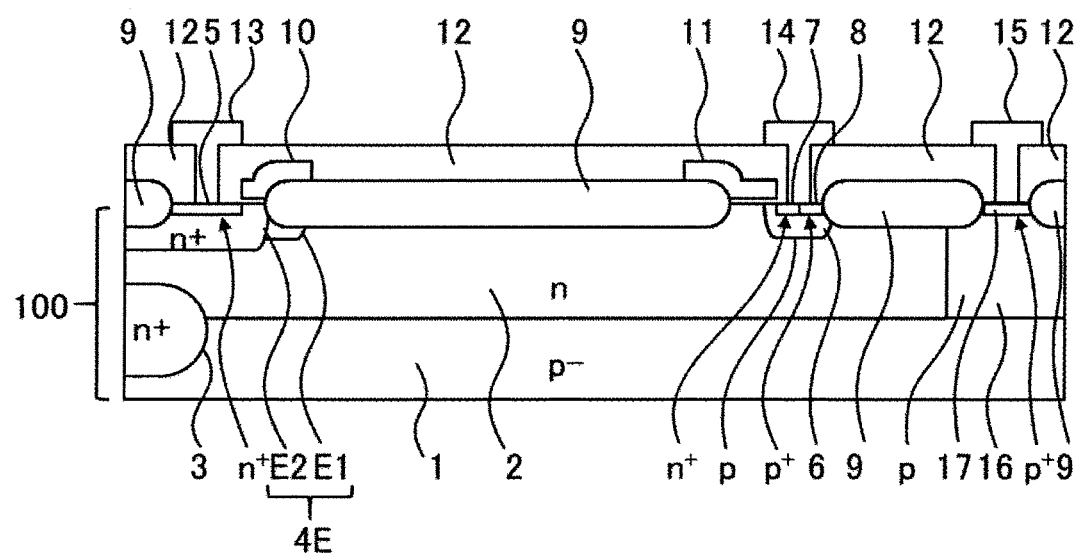
FIG. 9 is a cross-sectional view illustrating a schematic configuration of a semiconductor device according to a first embodiment.
Figure 10:
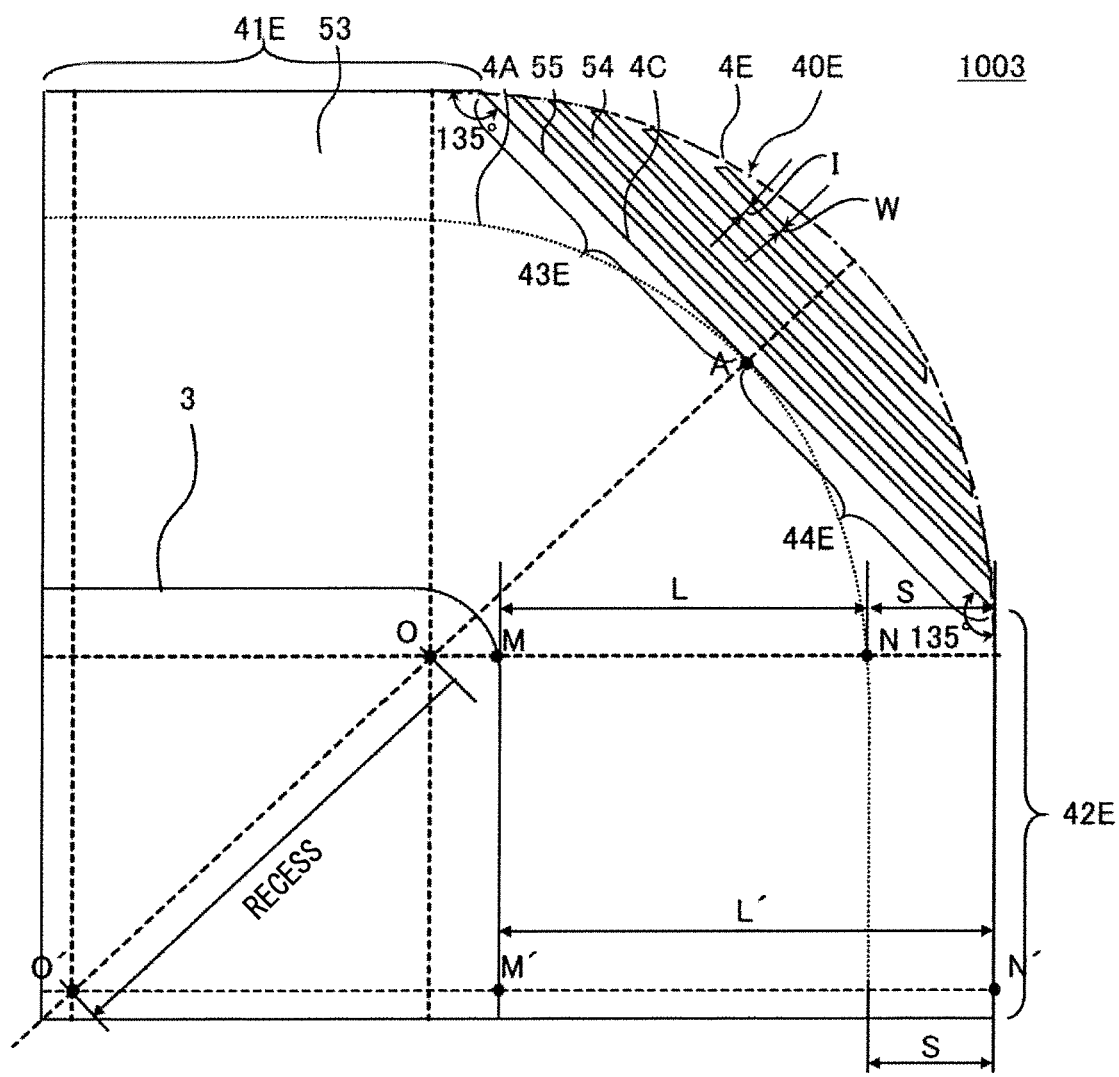
FIG. 10 is a plan view illustrating the schematic configuration of the semiconductor device according to the third embodiment.
Figure 12:
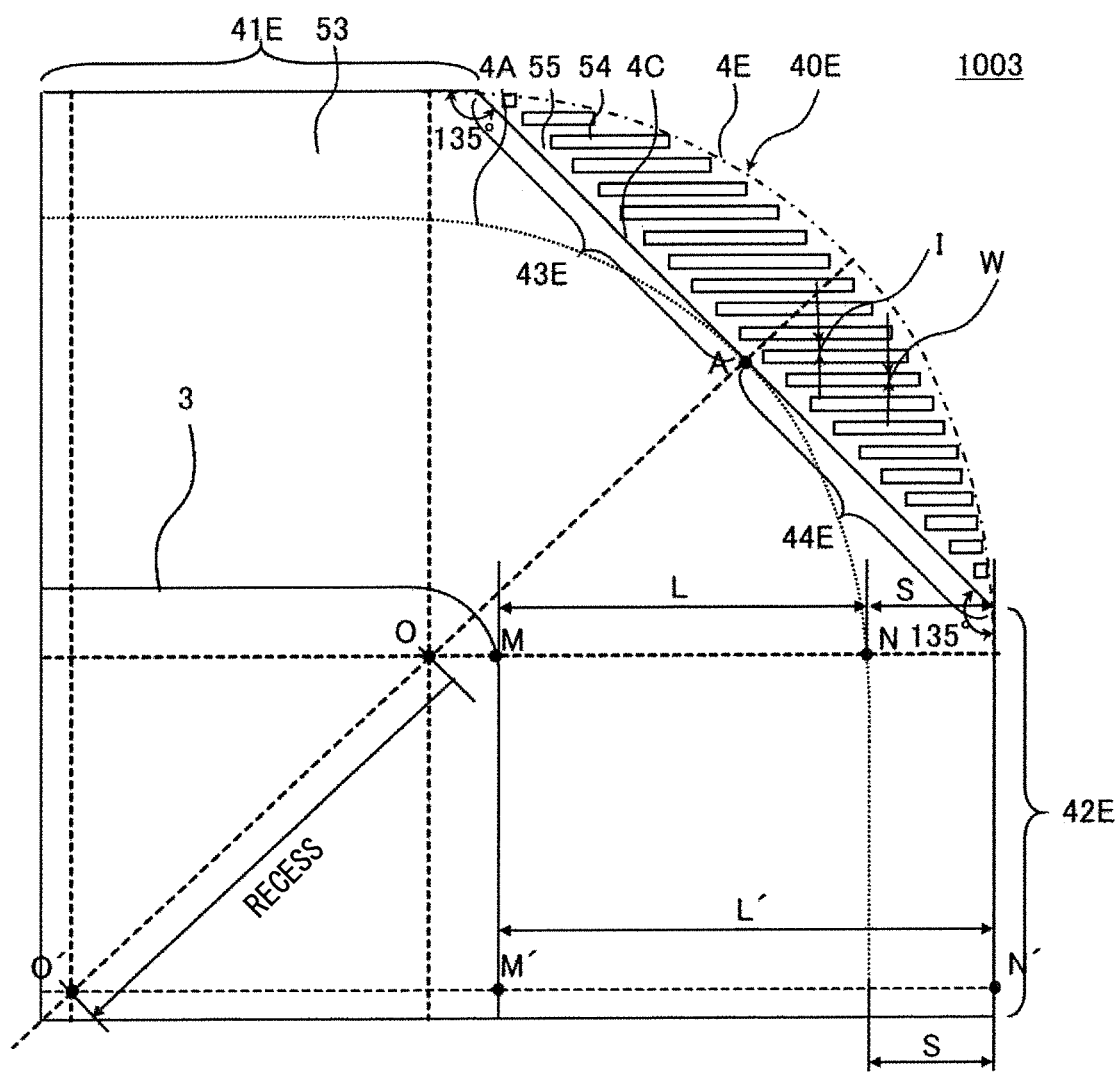
FIG. 12 is a plan view illustrating the schematic configuration of the semiconductor device according to the third embodiment.

FIG. 9 is a cross-sectional view illustrating a structure of a semiconductor device 1003 according to a third embodiment, and corresponds to a cross-section taken along line A-A in FIG. 2. FIGS. 10, 11, and 12 are plan views illustrating part of a corner area 51 and straight areas 52 of the third embodiment.

In the first embodiment, the configuration has been described, in which As illustrated in FIG. 3, the curvature of the curved portion 40 of the N-type semiconductor layer 4 is smaller than the curvature of the curved portion 30 of the buried layer 3, and the curvature center O' of the curved portion 40 of the N-type semiconductor layer 4 is receded toward the inner side in comparison with the curvature center O of the curved portion 30 of the buried layer 3, meanwhile, in the third embodiment, the curvature of the curved portion 40 of the N-type semiconductor layer 4 is smaller than the curvature of the curved portion 30 of the buried layer 3, and the curvature center O' of the curved portion of the N-type semiconductor layer 4 is the same position as the curvature center O of the curved portion 30 of the buried layer 3, which is a different respect from the first embodiment, and the impurity concentration of a part of the N-type semiconductor layer 4 including the curved portion 40 is different from that of the first embodiment. The rest of the configuration is the same as in the first embodiment, and the same reference numerals are given to the same or corresponding parts as in the first embodiment.

As illustrated in FIG. 9, an N-type semiconductor layer 4E includes two regions E1 and E2 with different impurity concentrations from each other. The region E1 is located at the end portion of the N-type semiconductor layer 4E, and the region E2 is located on the inner side than the region E1 is. The impurity concentration of the region E1 is lower than that of the region E2.

FIGS. 10, 11, and 12 are diagrams according to the third embodiment, in each of which an enlarged view of the buried layer 3 and the N-type semiconductor layer 4E in the corner region 51 illustrated in FIG. 2 is superimposed with a mask material 54 having a first impurity implantation opening 53, a plurality of second impurity implantation openings 54, and a blocking portion 55.

The one dot chain line represents a contour line that is the end portion of the N-type semiconductor layer 4E. The end portion of the N-type semiconductor layer 4E is defined by a straight portion 41E included in one straight area 52, a straight portion 42E included in an other straight area 52, and a curved portion 40E whose ends are connected to the straight portion 41E and the straight portion 42E, respectively. The contour line of the N-type semiconductor layer 4E substantially matches that of the N-type semiconductor layer 4B. The region E1 corresponds to a region including the curved portion 40E and located on the inner side of the curved portion 40E.

The solid lines represent the contour lines of the first impurity implantation opening 53 and the second impurity implantations openings 54. The blocking portion 55 of the mask material 56 is formed by removing the first impurity implantation opening 53 and the second impurity implantation openings 54 indicated by the solid lines from the N-type semiconductor layer 4E indicated by the one dot chain line.

The first impurity implantation opening 53 indicates the opening pattern of the mask material 56 for forming the region E2 of the N-type semiconductor layer 4E, and the shape of the first impurity implantation opening 53 substantially matches the shape of the N-type semiconductor layer 4C.

The second impurity implantation openings 54 indicate the opening pattern of the mask material 56 for forming the region E1 of the N-type semiconductor layer 4E. The second impurity implantation openings 54 are arranged in a region having a shape substantially matching the region obtained by removing the N-type semiconductor layer 4C from the N-type semiconductor layer 4E.

The boundary between the regions E1 and E2, which is respectively formed by the mask material 56 in each of FIGS. 10 to 12, is defined by a straight portion 43E connected to the straight portion 41E at an obtuse angle and a straight portion 44E connected to the straight portion 42E at an obtuse angle in plan view. The straight portion 43E and the straight portion 44E form one straight line.

In FIG. 10, the plurality of second impurity implantation openings 54 having a trapezoidal shape with a pattern width W are arranged in the region E1 along the tangential direction of the intersection point A at regular intervals of a pattern interval I.

In FIG. 11, a plurality of square dot-shaped second impurity implantation openings 54 are arranged in the region E1. Although an example in which the shape of the second impurity implantation openings 54 is a square dot shape is illustrated, as long as the shape takes a dot shape, any shape such as a chain dot shape, a round dot shape, may be adoptable.

In FIG. 12, the plurality of second impurity implantation openings 54 having a rectangular shape with a pattern width W are arranged in the region E1 along the horizontal direction at regular intervals of a pattern interval I.

Figure 13:
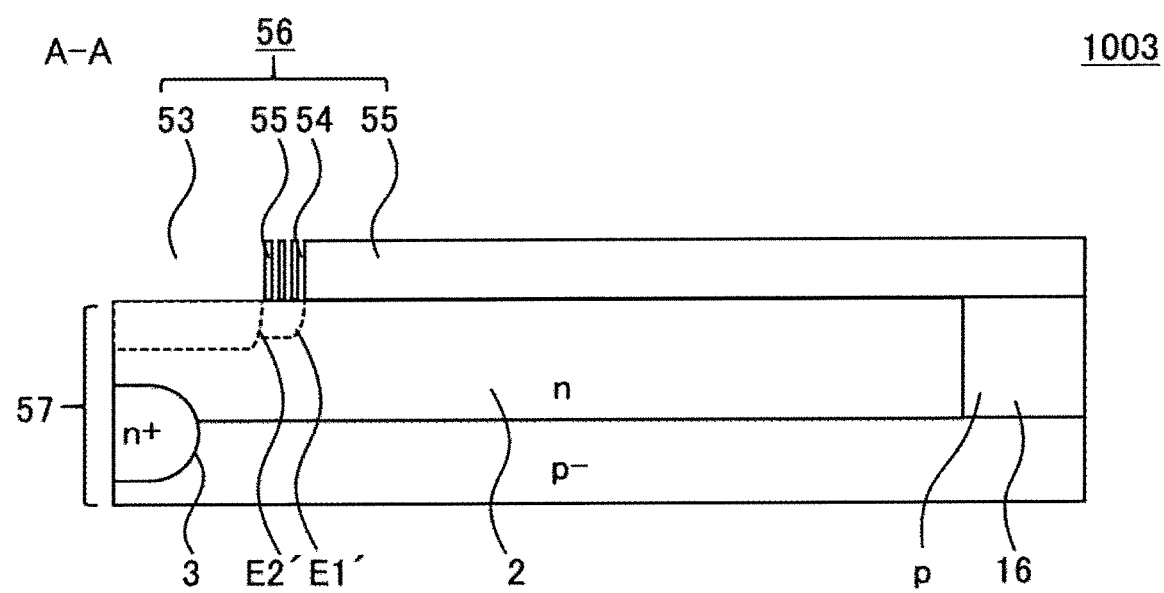
FIG. 13 is a cross-sectional view illustrating a method of manufacturing the semiconductor device according to the first embodiment.

Next, a method of manufacturing the semiconductor device 1003, in particular, a forming step of the N-type semiconductor layer 4E will be described with reference to FIG. 13. First, the mask material 56 provided with the first impurity implantation opening 53, the plurality of second implantation openings 54, and the blocking portion 55 defining those openings, illustrated in any of FIGS. 10 to 12, is formed on a base material 57, in a region E1' in the base material 57 corresponding to the region E1, and a region E2' in the base material corresponding to the region E2 in the corner area 51. The first impurity implantation opening 53 and the plurality of second impurity implantation openings 54 open the surface of the base material 57. Next, the base material 57 is irradiated with impurities. Impurities are introduced into the base material 57 through the first impurity implantation opening 53 and the plurality of second impurity implantation openings 54, and the introduction of the impurities is blocked by the blocking portion 55. After that, the base material 57 into which the impurities have been introduced is subjected to heat treatment. The heat treatment allows the impurities to be diffused in the direction in which the concentration becomes uniform, and the N-type semiconductor layer 4E illustrated in FIG. 9 is formed. The mask material 56 having the opening pattern of the second impurity implantation openings 54 in the region E1' partially blocks the impurities to diffuse; therefore, as illustrated in FIG. 9, the region E1 having an impurity concentration lower than that of the region E2 is formed. Although the mask material 56 is removed after the impurities are introduced and before the heat treatment, the mask material 56 may be removed after the heat treatment.

In a semiconductor device 1003 of the second embodiment, when the N-type semiconductor layer 4A is elongated to become the N-type semiconductor layer 4E, the distance L of the N-type semiconductor layer 4A is increased by the elongation value S, so that the on-resistance is reduced. Further, by arranging the second impurity implantation openings 54 in the region E1 and making the impurity concentration lower than that in the region E2, the concentration of electric field in the corner area 51 of the N-type semiconductor layer 4E is suppressed and a reduction in breakdown voltage property is prevented as compared with the N-type semiconductor layer 4B.

Figure 14:
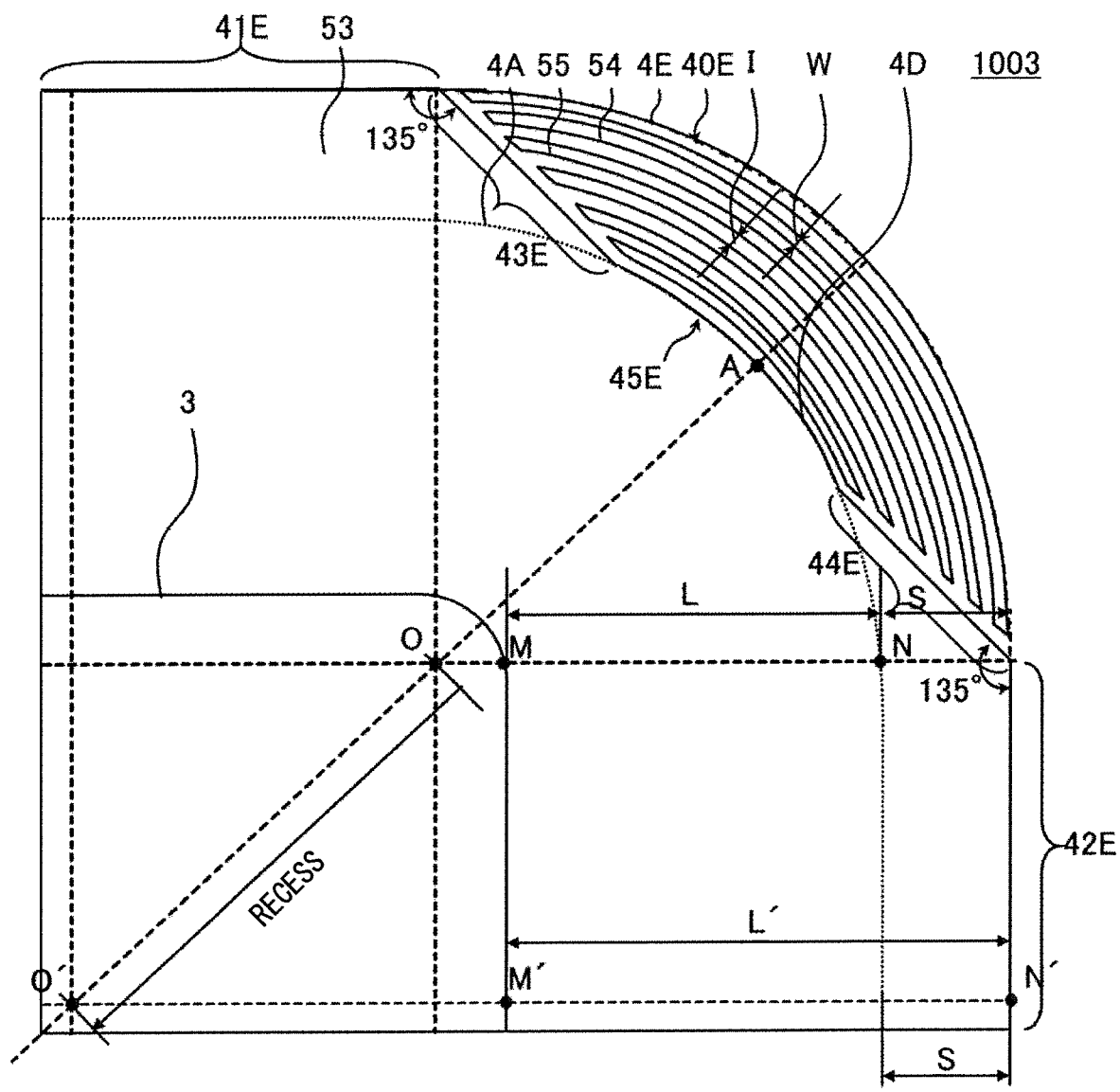
FIG. 14 is a plan view illustrating the schematic configuration of the semiconductor device according to the third embodiment.

Although the example in which the second impurity implantation openings 54 are arranged in the region E1 is illustrated in the third embodiment, as illustrated in FIG. 14 the second impurity implantation openings 54 may be arranged along the curvature of the curved portion 40A of the N-type semiconductor layer 4A at equal intervals at the pattern interval I. Also in the N-type semiconductor layer 4E formed using the mask material 56 of FIG. 14, the two regions E1 and E2 with different impurity concentrations are formed.

The difference among the N-type semiconductor layers 4E formed using the mask material 56 in FIGS. 10 to 12 is the shape of the region E2.

The contour line of the N-type semiconductor layer 4E substantially matches that of the N-type semiconductor layer 4B in plan view, and the region E1 corresponds to the region formed by removing the N-type semiconductor layer 4D from the N-type semiconductor layer 4B. The region E2 corresponds to a region formed by removing the region E1 from the N-type semiconductor layer 4E. Therefore, the boundary between the region E1 and the region E2 is, in plan view, is defined by the straight portion 43E connected to the straight portion 41E at an obtuse angle, the straight portion 44E connected to the straight portion 42E at an obtuse angle, and a curved portion 45E each of both ends is connected to the straight portion 43E and the straight portion 44E. The impurity concentration of the region E1 is higher than that of the region E2.

Further, in the third embodiment, an example in which the shape of the second impurity implantation openings 54 is trapezoidal, dot-shaped, or rectangular has been illustrated, however, the shape, dimensions, and arrangement intervals of the second impurity implantation openings 54 are not limited thereto.

Although the corner area 51 has been described in FIGS. 10, 11, 12, and 14, the same configuration as any of FIGS. 10, 11, 12, and 14 is applicable to the shapes of the other three corner areas.

Also, the back gate layer and the source layer of the second embodiment may be configured like the P-type semiconductor layer 16 and the N-type semiconductor layers 18 and 19 in FIG. 6.

Fourth Embodiment

Figure 15:
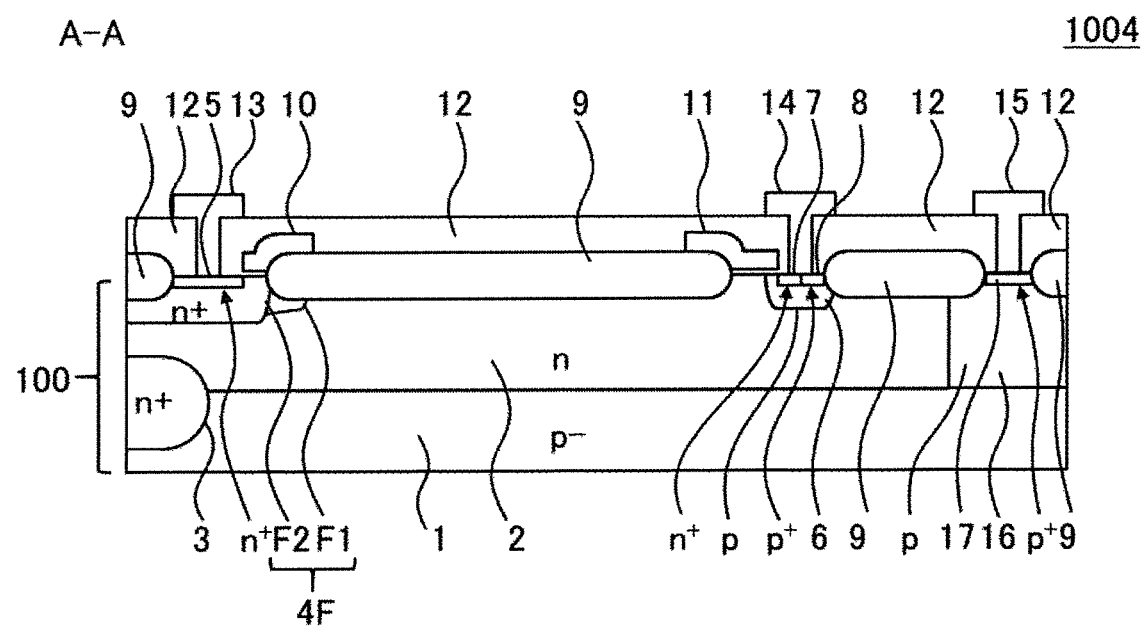
FIG. 15 is a cross-sectional view illustrating a schematic configuration of a semiconductor device according to a fourth embodiment.

FIG. 15 is a cross-sectional view illustrating a structure of a semiconductor device 1004 according to a fourth embodiment, and corresponds to the cross-section taken along line A-A in FIG. 2. FIGS. 16, 17, 18, 19, and 20 are plan views illustrating part of a corner area 51 and straight areas 52 of the fourth embodiment.

In the third embodiment, the configuration in which the impurity concentration is higher in the region E2 than in the region E1 has been described. The fourth embodiment differs from the third embodiment in that the impurity concentration is higher in a region F2 than in that in a region F1, which are described later, and a concentration gradient is given to the impurity concentration of the region F1. The rest of the configuration is the same as in the third embodiment, and the same reference numerals are given to the same or corresponding parts as in the third embodiment.

As illustrated in FIG. 15, the N-type semiconductor layer 4F includes the two regions F1 and F2 with different impurity concentrations from each other. The region F1 is located at the end portion of the N-type semiconductor layer 4F, and the region F2 is located on the inner side than the region F1 is. The impurity concentration of the region F1 is lower than that of the region F2.

Figure 16:
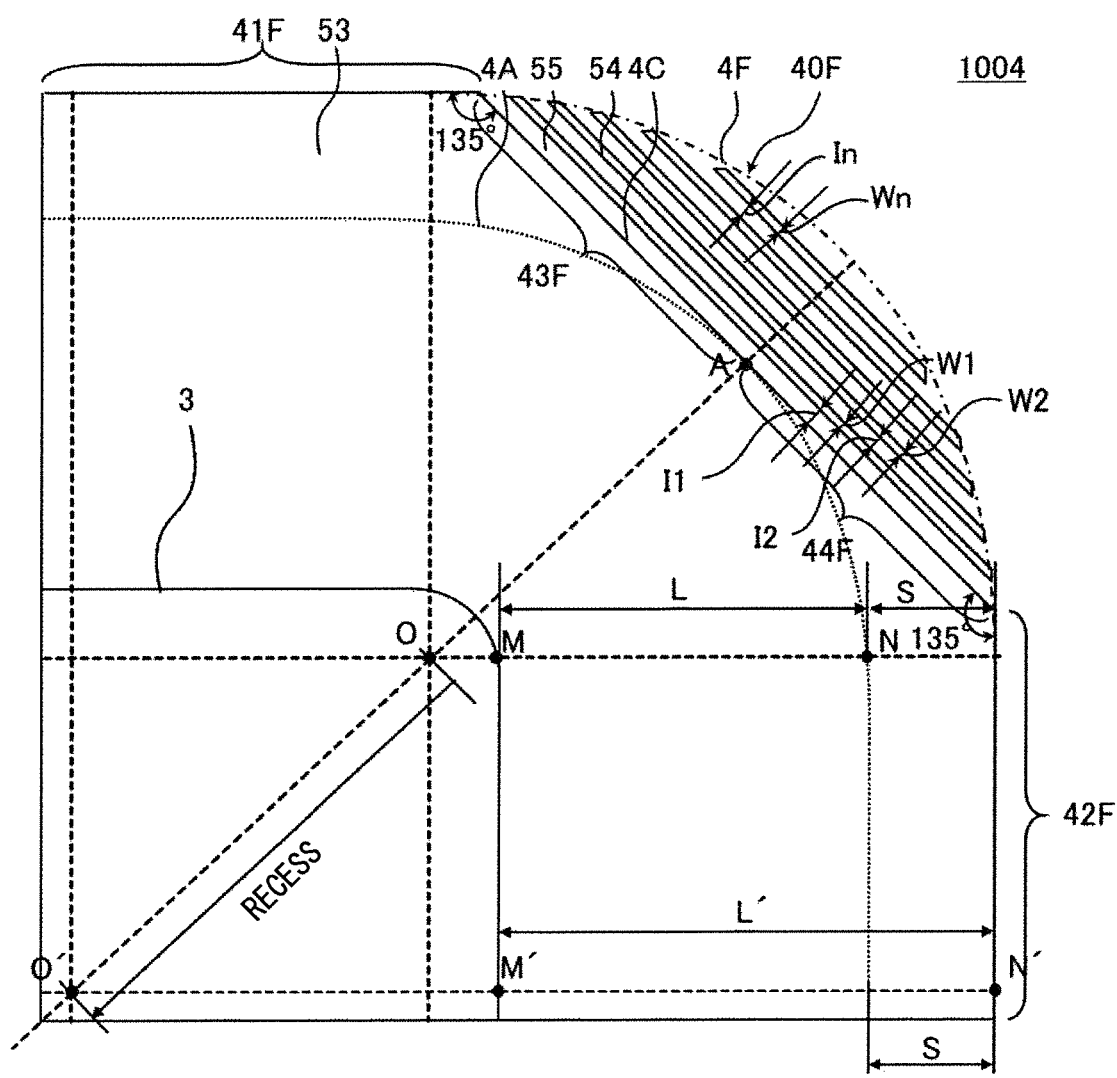
FIG. 16 is a plan view illustrating the schematic configuration of the semiconductor device according to the fourth embodiment.

FIG. 16 is diagram according to the fourth embodiment, in which an enlarged view of the buried layer 3 and the N-type semiconductor layer 4F in the corner region 51 illustrated in FIG. 2 is superimposed with a mask material 54 having a first impurity implantation opening 53, a plurality of second impurity implantation openings 54, and a blocking portion 55.

The one dot chain line represents a contour line that of the N-type semiconductor layer 4F. The end portion of the N-type semiconductor layer 4F is defined by a straight portion 41F included in one straight area 52, a straight portion 42F included in an other straight area 52, and a curved portion 40F whose ends are connected to the straight portion 41F and the straight portion 42F, respectively. The contour line of the N-type semiconductor layer 4F substantially matches that of the N-type semiconductor layer 4B. The region F1 corresponds to a region including the curved portion 40F and located on the inner side of the curved portion 40F.

The solid lines represent the contour lines of the first impurity implantation opening 53 and the second impurity implantations openings 54. The blocking portion 55 of the mask material 56 is formed by removing the first impurity implantation opening 53 and the second impurity implantation openings 54 indicated by the solid lines from the N-type semiconductor layer 4F indicated by the one dot chain line.

The first impurity implantation opening 53 indicates the opening pattern of the mask material 56 for forming the region F2 of the N-type semiconductor layer 4F, and the shape of the first impurity implantation opening 53 substantially matches the shape of the N-type semiconductor layer 4C.

The second impurity implantation openings 54 indicate the opening pattern of the mask material 56 for forming the region F1 of the N-type semiconductor layer 4F. The second impurity implantation openings 54 are arranged in a region having a shape substantially matching the region obtained by removing the N-type semiconductor layer 4C from the N-type semiconductor layer 4F.

The boundary between the regions F1 and F2, which is respectively formed by the mask material 56 in FIG. 16 is defined by a straight portion 43F connected to the straight portion 41F at an obtuse angle and a straight portion 44F connected to the straight portion 42F at an obtuse angle in plan view. The straight portion 43F and the straight portion 44F form one straight line.

FIG. 16 illustrates the arrangement of the second impurity implantation openings 54, in a manner where each of the second implantation openings 54 has the pattern width W which is narrower than the next one and each pattern interval I is formed which is wider than the next one in the direction toward a portion corresponding to the curved portion 40F, that is, the closer the second implantation opening 54 formed to the outer side of the semiconductor device 1004 is, the narrower the pattern width W the second implantation opening 54 has so as to establish W1>W2 . . . >Wn, and the wider each pattern interval I is formed so as to establish I1<I2 . . . <In.

In a semiconductor device 1004 of the second embodiment, when the N-type semiconductor layer 4A is elongated to become the N-type semiconductor layer 4F, the distance L of the N-type semiconductor layer 4A is increased by the elongation value S, so that the on-resistance is reduced. Further, by arranging the second impurity implantation openings 54 in the region F1 and making the impurity concentration lower than that in the region F2, and the impurity concentration of the region F1 lowers toward the outer side of semiconductor device 1004, the concentration of electric field in the corner area 51 of the N-type semiconductor layer 4F is suppressed and a reduction in breakdown voltage property is prevented as compared with the N-type semiconductor layer 4B.

It should be noted that, although in the fourth embodiment, an example of the arrangement of the second impurity implantation openings 54 has been described, as being in a manner where each of the second implantation openings 54 has the pattern width W which is narrower than the next one and each pattern interval I is formed which is wider than the next one, and the closer the second implantation opening 54 formed to the outer side of the semiconductor device 1004 is, the narrower the pattern width W the second implantation opening 54 has so as to establish W1>W2 . . . >Wn, and the wider each pattern interval I is formed so as to establish I1<I2 . . . <In, however, not both of the pattern widths W and the pattern intervals I of the second implantation openings 54 are required to be changed in widths and intervals thereof as they are provided closer to the outer side of the semiconductor device 1004, either ones of the pattern widths W or the pattern intervals I may have a fixed width or a fixed interval.

Figure 17:
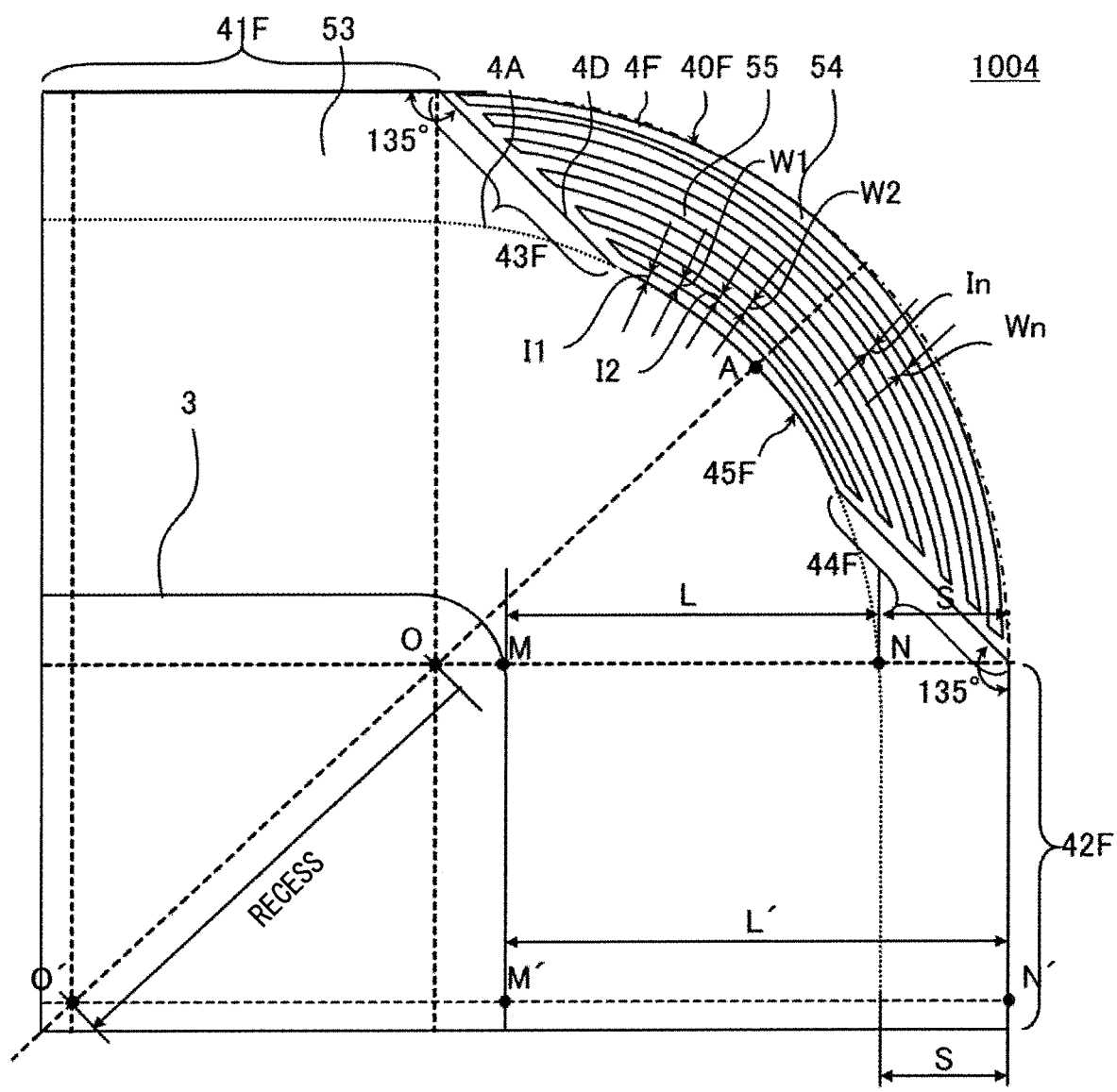
FIG. 17 is a plan view illustrating the schematic configuration of the semiconductor device according to the fourth embodiment.
Figure 18:
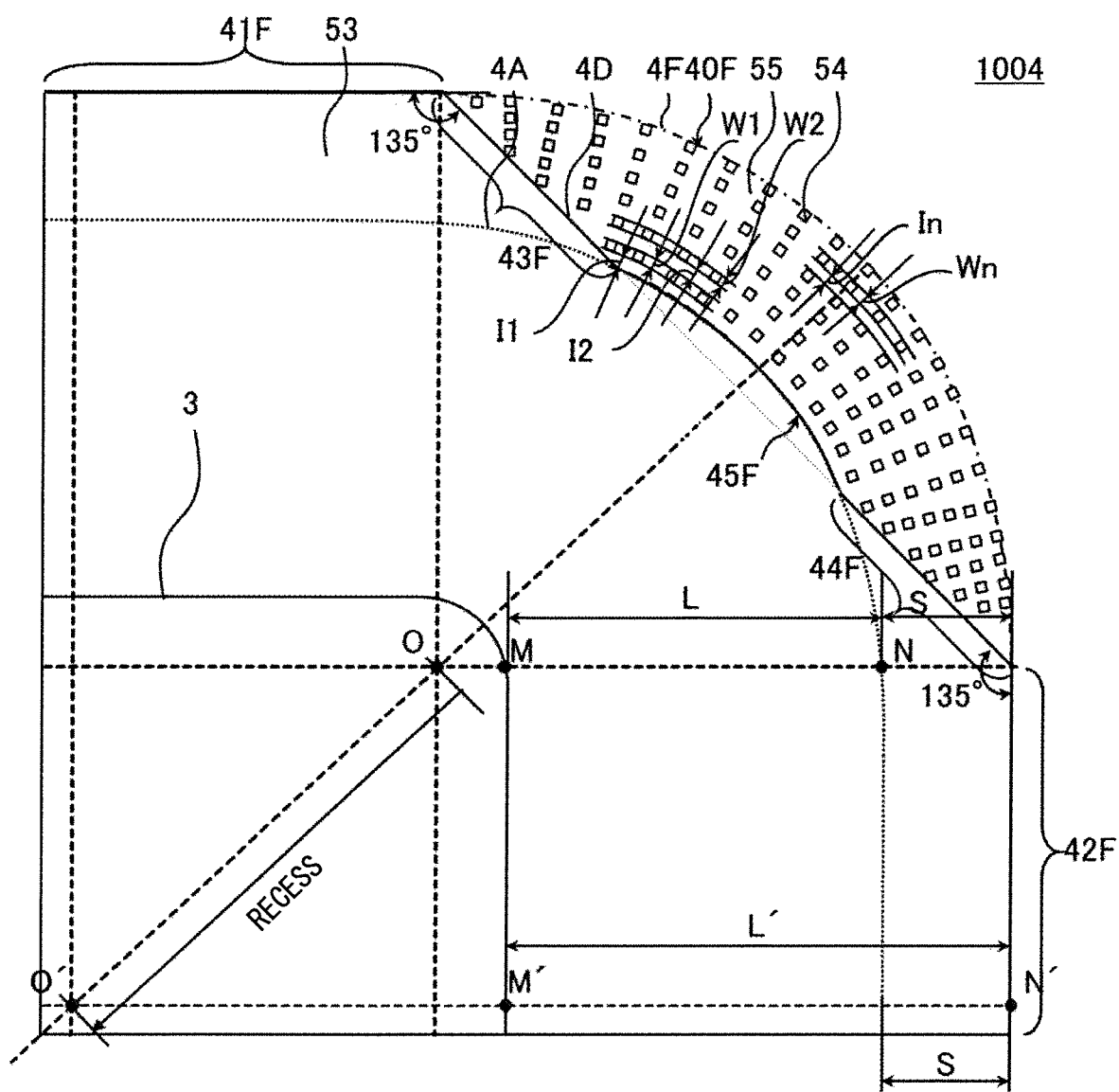
FIG. 18 is a plan view illustrating the schematic configuration of the semiconductor device according to the fourth embodiment.

The N-type semiconductor layer 4F illustrated in FIGS. 17 and 18 is configured with the two regions F1 and F2 with different impurity concentrations. The contour line of the N-type semiconductor layer 4F substantially matches that of the N-type semiconductor layer 4B in plan view, and the region F1 corresponds to the region formed by removing the N-type semiconductor layer 4D from the N-type semiconductor layer 4B. The region F2 corresponds to a region formed by removing the region F1 from the N-type semiconductor layer 4F. Therefore, the boundary between the region F1 and the region F2 is, in plan view, is defined by the straight portion 43F connected to the straight portion 41F at an obtuse angle, the straight portion 44F connected to the straight portion 42F at an obtuse angle, and a curved portion 45F each of both ends is connected to the straight portion 43F and the straight portion 44F. The impurity concentration is higher in the region F2 than in the region F1, and the impurity concentration in the region F1 lowers toward the outer side of the semiconductor device 1004.

For forming the N-type semiconductor layer 4F, an arrangement may also be adopted in which, the second impurity implantation openings 54 are in a manner where each of the second implantation openings 54 has the pattern width W which is narrower than the next one and each pattern interval I is formed which is wider than the next one, and the closer the second implantation opening 54 formed to the outer side of the semiconductor device 1004 is, the narrower the pattern width W the second implantation opening 54 has so as to establish W1>W2 . . . >Wn, and the wider each pattern interval I is formed so as to establish I1<I2 . . . <In, in the region F1 corresponding to the region formed by removing the N-type semiconductor layer 4D from the N-type semiconductor layer 4B, as illustrated in FIGS. 17 and 18. In FIG. 17, the second impurity implantation openings 54 having a strip-shape are aligned, and in FIG. 18, the second impurity implantation openings 54 having a dot-shape are arranged radially.

Figure 19:
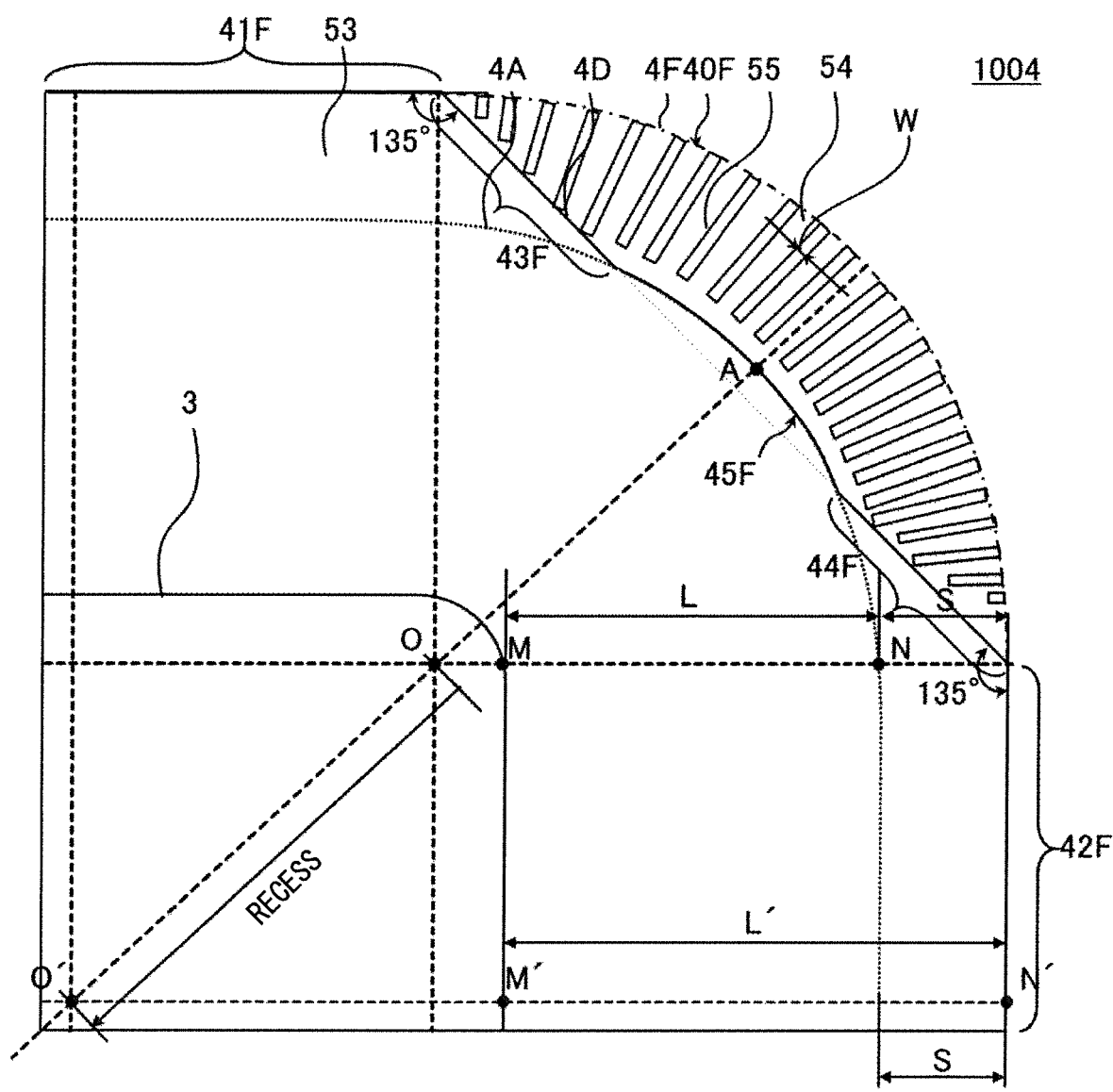
FIG. 19 is a plan view illustrating the schematic configuration of the semiconductor device according to the fourth embodiment.
Figure 20:
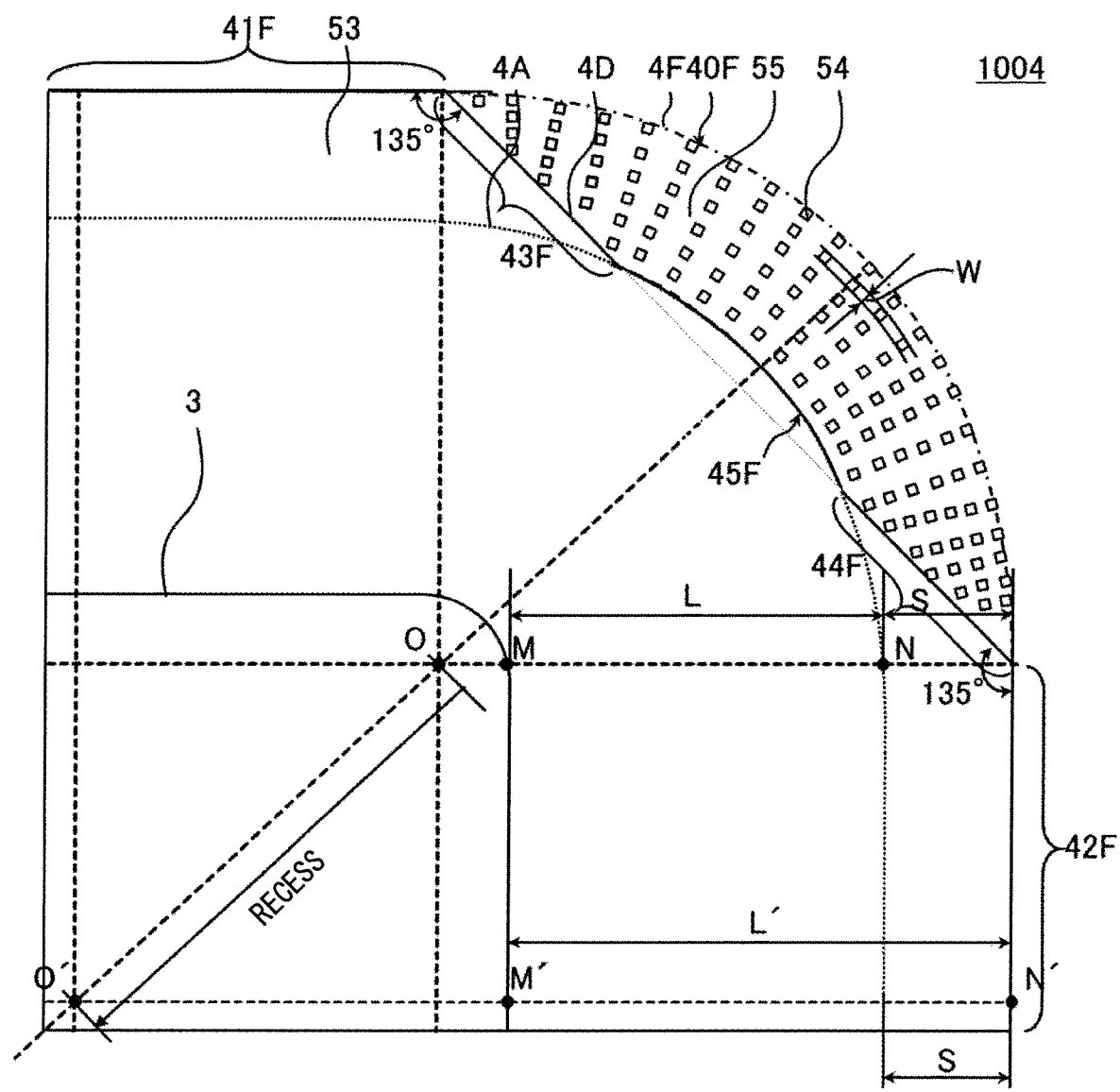
FIG. 20 is a plan view illustrating the schematic configuration of the semiconductor device according to the fourth embodiment.

Further, although in the fourth embodiment, an example is illustrated in which the pattern widths W and the pattern intervals I of the second impurity implantation openings 54 are gradually changed as they are provided closer to the outer side of the semiconductor device 1004 so that the impurity concentration of the region F1 lowers toward the outer side of the semiconductor device 1004, as illustrated in FIGS. 19 and 20, the second impurity implantation openings 54 may simply be arranged radially with the pattern widths W being constant. FIG. 19 illustrates the second impurity implantation openings 54 having a rectangular shape, and FIG. 20 illustrates the second impurity implantation openings 54 having a dot-shape. In both FIGS. 19 and 20, every interval between the second impurity implantation openings 54 adjacent each other in the direction along the curved portion increases in the radial direction.

Although in FIGS. 16 to 20, the corner area 51 has been described, the same configuration as in FIGS. 16 to 20 is applicable to the shapes of the other three corner areas.

Also, the back gate layer and the source layer of the second embodiment may be configured like the P-type semiconductor layer 16 and the N-type semiconductor layers 18 and 19 in FIG. 6.

In addition to the above, the embodiments can be combined, components of the embodiments can appropriately be modified, or components of embodiments can appropriately be omitted.

While the disclosure has been illustrated and described in detail, the foregoing description is in all aspects illustrative and not restrictive. It is therefore understood that numerous modifications and variations can be devised without departing from the scope of the invention.

What is claimed is:

1. A semiconductor device comprising:
a semiconductor substrate of a first conductivity type;
a RESURF layer of a second conductivity type formed in a surface portion of the semiconductor substrate and separating a high-side circuit and a low-side circuit;
a buried layer provided between the semiconductor substrate and the RESURF layer, formed at a bottom of the high-side circuit and having an impurity concentration higher than that of the RESURF layer; and
a MOSFET having the RESURF layer serving as a drift layer, wherein
the MOSFET includes
a first semiconductor layer of the second conductivity type formed in a surface portion of the RESURF layer having an impurity concentration higher than that of the RESURF layer, and serving as a drift layer,
a second semiconductor layer of the first conductivity type provided on a side away from the high-side circuit further than the first semiconductor layer is, and
a third semiconductor layer of the second conductivity type formed in a surface portion of the second semiconductor layer, and serving as a source layer,
an end portion of the first semiconductor layer is located at a position further away from the high-side circuit than an end portion of the buried layer is,
the end portion of the buried layer has a first straight portion, a second straight portion, and a curved portion whose ends are connected to the first straight portion and the second straight portion, respectively, in plan view,
the end portion of the first semiconductor layer has a third straight portion, a fourth straight portion, and a curved portion whose ends are connected to the third straight portion and the fourth straight portion, respectively, in plan view,
a position of a curvature center of the curved portion of the first semiconductor layer is closer to the high-side circuit than the curved portion of the buried layer is, and
a curvature of the curved portion of the first semiconductor layer is smaller than the curved portion of the buried layer.

2. The semiconductor device according to claim 1, wherein
the second semiconductor layer is formed in a surface portion of the RESURF layer.

3. The semiconductor device according to claim 1, wherein
the second semiconductor layer is formed in a surface portion of the semiconductor substrate so as to be in contact with the RESURF layer.

4. The semiconductor device according to claim 1, further comprising
a fourth semiconductor layer of the second conductivity type formed in a surface portion of the first semiconductor layer, having an impurity concentration higher than that of the first semiconductor layer, and serving as a drift layer.

5. The semiconductor device according to claim 1, wherein
the MOSFET is an element constituting a bootstrap circuit supplying a power source to the high-side circuit.

* * * * *